United States Patent [19]
Lecklider et al.

[11] Patent Number: 5,434,593
[45] Date of Patent: Jul. 18, 1995

[54] DISPLAY RESOLUTION ENHANCEMENT USING DATA COMPRESSION AND OVERLAPPING TECHNIQUES

[75] Inventors: Thomas H. Lecklider, Saffron Walden; Christopher Cox, Histon, both of England

[73] Assignee: Gould Instrument Systems, Inc., Valley View, Ohio

[21] Appl. No.: 59,095

[22] Filed: May 10, 1993

[30] Foreign Application Priority Data

Oct. 13, 1992 [GB] United Kingdom ................ 9221509

[51] Int. Cl.⁶ .......................................... G09G 1/14
[52] U.S. Cl. .................... 345/134; 345/133; 345/147
[58] Field of Search ............... 345/113, 114, 202, 203, 345/189, 132, 133, 134, 147

[56] References Cited

U.S. PATENT DOCUMENTS

| | | |
|---|---|---|
| 4,068,310 | 1/1978 | Friauf . |
| 4,193,122 | 3/1980 | Bowers . |
| 4,208,723 | 6/1980 | Lecklider . |
| 4,251,814 | 2/1981 | Dagostino . |
| 4,263,593 | 4/1981 | Dagostino et al. . |
| 4,283,713 | 8/1981 | Philipp . |
| 4,464,656 | 8/1984 | Nakamura . |
| 4,531,120 | 7/1985 | Brownell, Jr. et al. ............. 345/114 |
| 4,647,922 | 3/1987 | Saxe . |
| 4,681,297 | 7/1987 | Iwami ................................. 345/113 |
| 4,686,521 | 8/1987 | Beaven et al. ....................... 345/114 |
| 4,816,813 | 3/1989 | Furno et al. ......................... 345/189 |
| 4,837,447 | 6/1989 | Pierce et al. . |
| 4,879,605 | 11/1989 | Warkentin et al. . |
| 4,940,931 | 7/1990 | Katayama et al. . |
| 5,081,594 | 1/1992 | Horsley . |
| 5,254,983 | 10/1993 | Long et al. .......................... 345/134 |
| 5,283,596 | 2/1994 | Long .................................... 345/134 |

FOREIGN PATENT DOCUMENTS

0347901 6/1989 European Pat. Off. .
2214764 1/1989 United Kingdom .

*Primary Examiner*—Ulysses Weldon
*Assistant Examiner*—Matthew Luu
*Attorney, Agent, or Firm*—Renner, Otto, Boisselle & Sklar

[57] ABSTRACT

A display resolution enhancement technique which provides a means for prioritizing and displaying overlapping images on a display based on the intensity levels of each respective image for each display element.

25 Claims, 17 Drawing Sheets

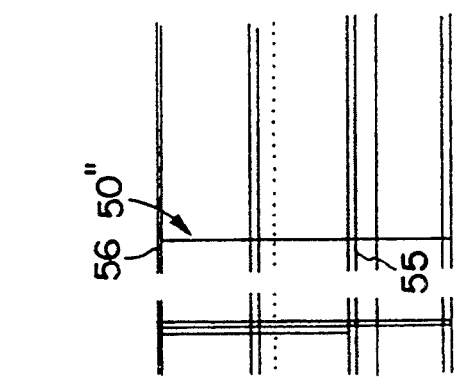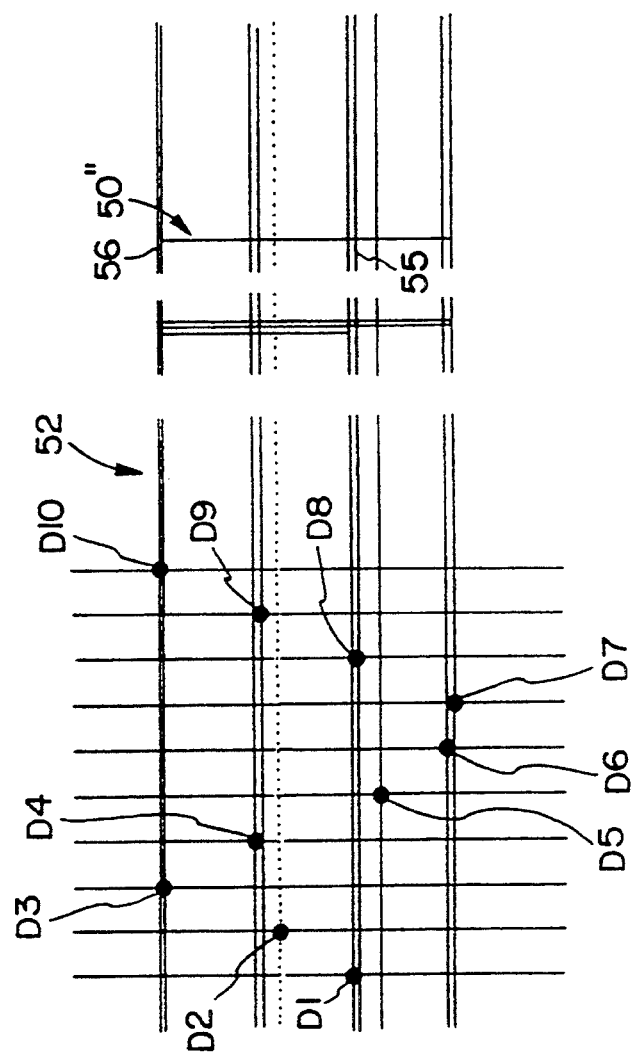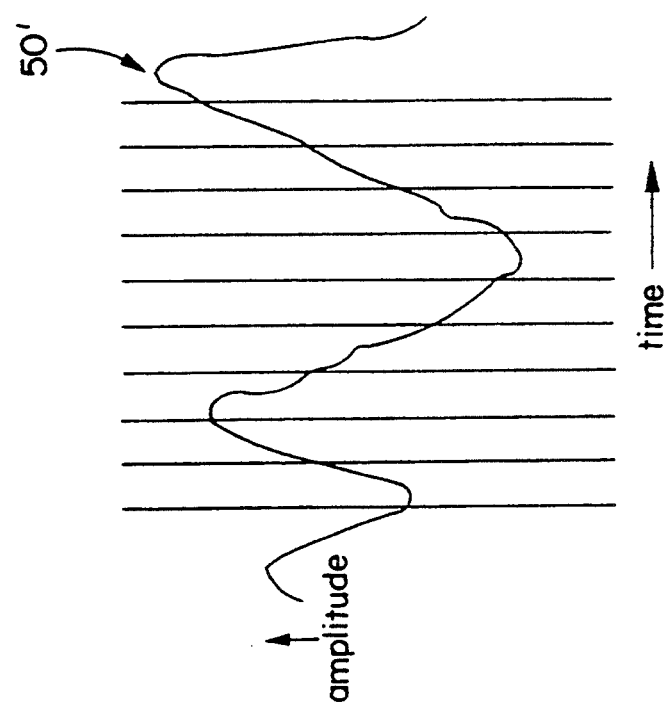

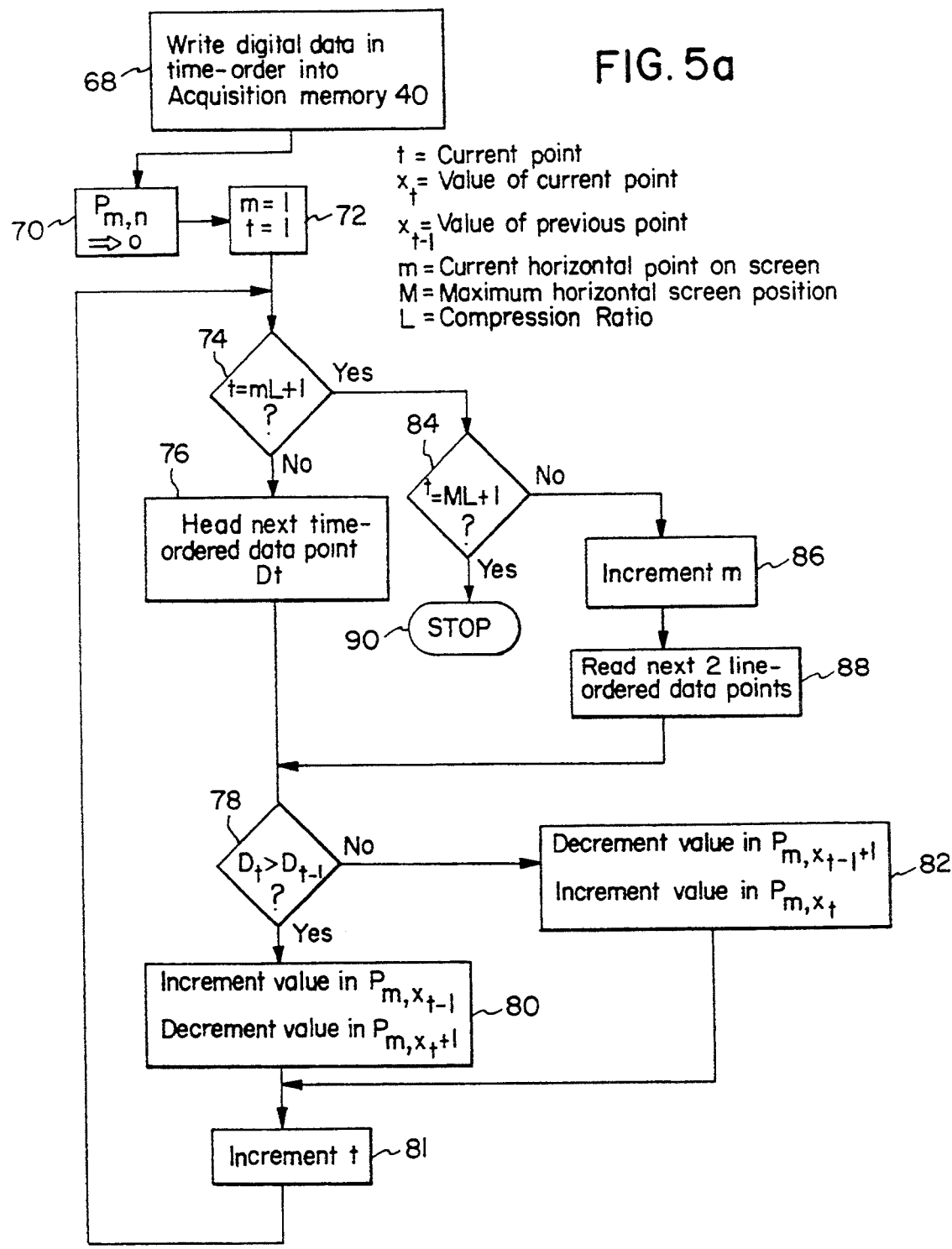

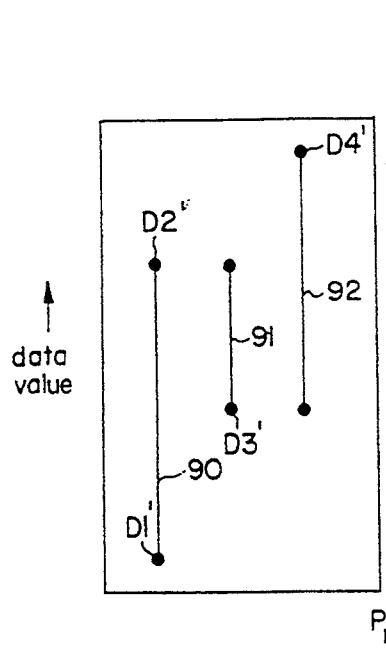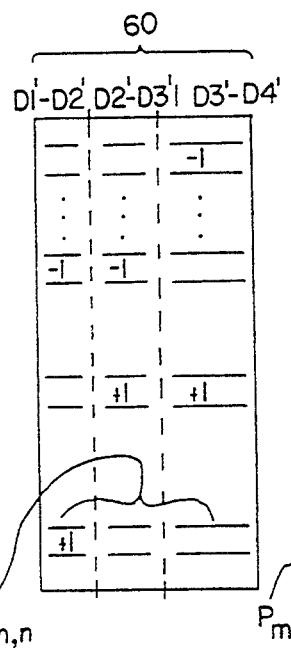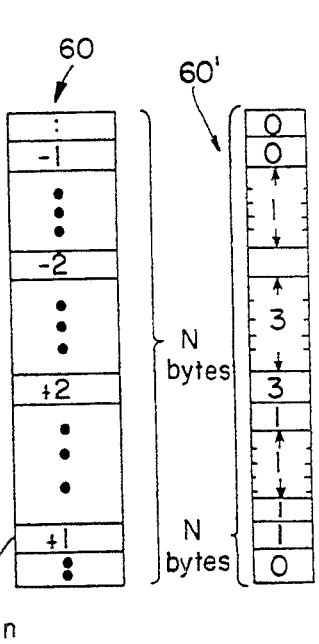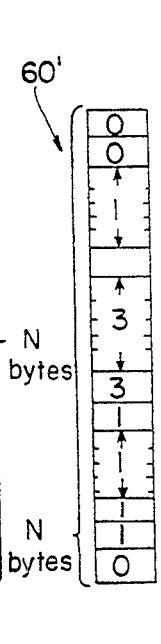
FIG.6a  FIG.6b  FIG.6c  FIG.6d
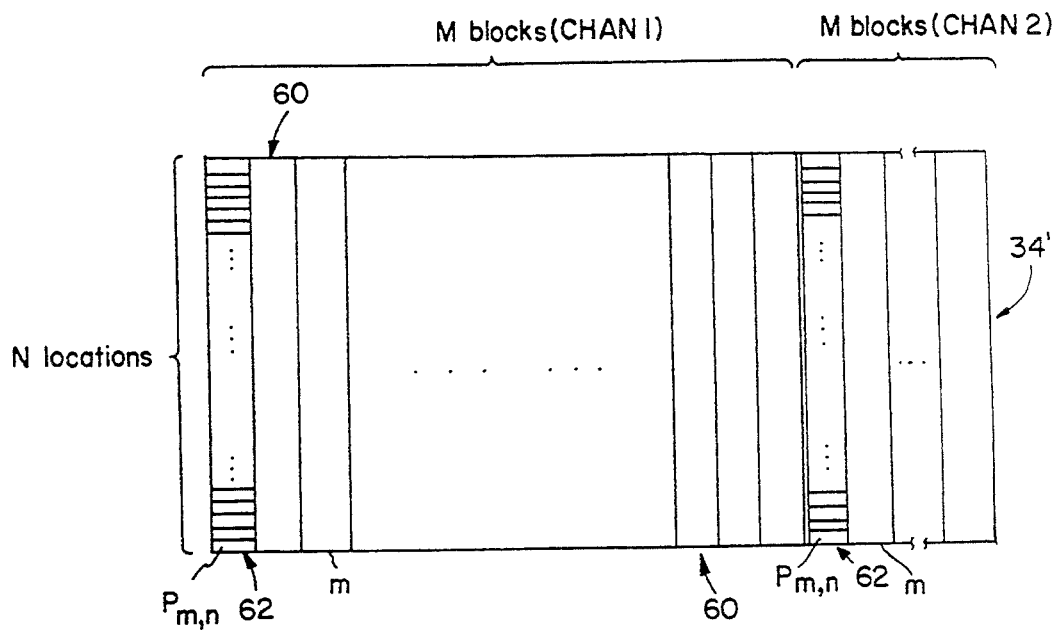
FIG.5b

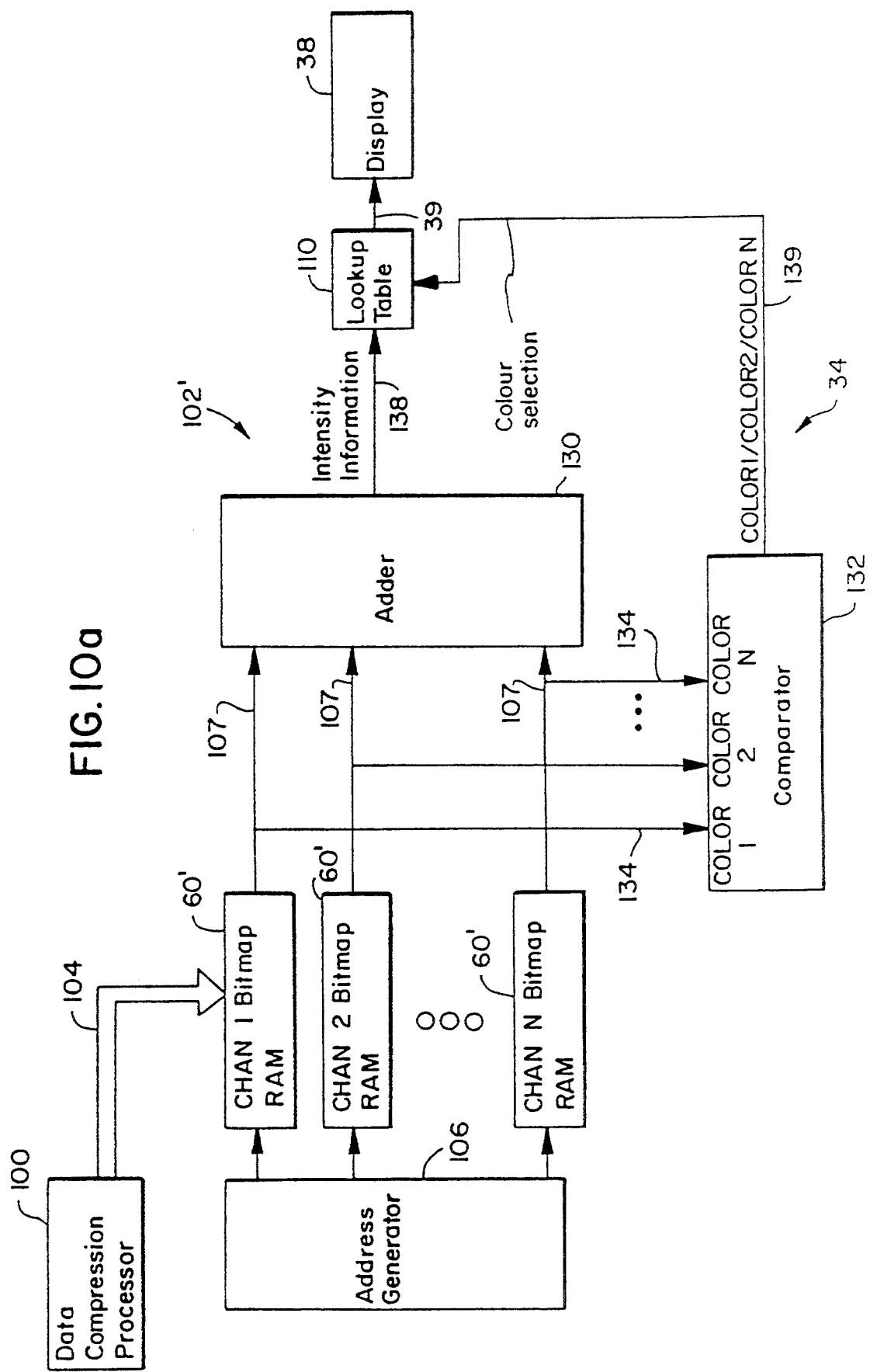

DISPLAY RESOLUTION ENHANCEMENT USING DATA COMPRESSION AND OVERLAPPING TECHNIQUES

TECHNICAL FIELD

The present invention relates generally to a system for displaying data, and more particularly to a display resolution enhancement system using data compression and overlapping techniques.

BACKGROUND OF THE INVENTION

Information displays such as raster displays, liquid crystal displays (LCDs), plasma displays, etc., are known in the art. Information displays provide a means for displaying an image based on a collection of data points stored in memory or the like. The image can be a waveform, a computer-assisted drawing, or any other type of image which can be represented by a collection of data points.

Unfortunately, there are several drawbacks associated with existing methods for displaying data on an information display. For example, a raster display, as well as other types of information displays, has limited resolution as is known. Typically the resolution is defined in terms of the number of horizontal and vertical lines in the display or the number of picture elements (pixels). Using conventional display techniques, an image formed by a collection of data points typically will appear rough and will not include the desired amount of visual detail unless a very high resolution display is available or some type of enhancement is provided. Moreover, in the case of an oscilloscope display where the image to be displayed is a discontinuous or fast-moving waveform, for example, the data shown on the display can be largely separated resulting in a poor clarity display. In the event the data points representing the waveform are compressed using conventional techniques, useful information such as maximum and minimum excursions of the waveform can be lost.

Still another drawback associated with displaying data points on a raster display or other type of information display involves displaying overlapping images. As an example, two or more images, each comprising a separate waveform for example, may overlap on the raster display. In the past, it has been difficult to discern image information on the raster display at the locations where the waveforms overlap or intersect. Because such overlap typically is displayed at the same uniform intensity and/or color as the remainder of the respective waveforms themselves, it has been difficult to ascertain relative information regarding the waveforms.

For example, FIG. 1a illustrates an overlapping squarewave 5 and sawtooth waveform 7 as shown on a monochrome information display 10 for an oscilloscope using conventional techniques. The information display 10 includes a plurality of pixels or display elements 12 arranged in a matrix which are selectively illuminated as a function of the data points representing the respective waveforms. In the areas 14 where the waveforms 5 and 7 overlap, the display elements 12 are illuminated at the same uniform intensity as the remaining illuminated display elements 12 representing the remainder of the respective waveforms. As can be seen in FIG. 1a, it is difficult, if not impossible, to determine information regarding the individual waveforms 5 and 7 in the overlap areas 14.

Techniques used in the past to distinguish better the overlapping images or waveforms on a monochrome information display 10 have met with limited success. For example, markers have been displayed on each waveform at regular intervals, with different shaped markers denoting different waveforms. Alternatively, different patterns have been used for each waveform so as to enable the viewer to better distinguish the respective waveforms. In other conventional displays, three dimensional imaging has been provided whereby perspective is used to distinguish each waveform. Unfortunately, such conventional techniques tend to clutter the display and/or contribute significantly to the expense and complexity of the overall display system.

Conventional techniques for displaying overlapping images or waveforms on a color information display 10 also include various shortcomings. For example, each of the waveforms 5 and 7 is assigned a different priority and color on the information display 10. The waveform with the higher priority is written over that with lower priority in the areas 14 where the waveforms overlap. FIG. 1b illustrates such a technique where the squarewave 5 and the sawtooth waveform 7 are displayed in different colors (represented by different direction shading lines on the respective display elements 12), with the waveform 7 having the higher priority. However, there still have been problems distinguishing the waveforms 5 and 7 in the areas 14 where the waveforms overlap. In some instances one waveform can completely obscure another waveform as will be appreciated.

Another conventional display technique involves using a different color on the information display 10 in the areas where the waveforms overlap. For example, FIG. 1c illustrates how a third color (represented by cross shading) is used for the display elements 12 in the areas 14 where the waveforms 5 and 7 overlap. While this allows the viewer to see that the traces overlay each other, it will be appreciated that the discontinuity in trace color can make it difficult for the viewer to detect properly the shape of the respective waveforms.

In view of the aforementioned shortcomings associated with existing techniques for displaying data points on an information display such as a raster display, there is a strong need in the art for an apparatus and method for displaying such data points, particularly those representing overlapping images, so as to provide a display which appears more continuous, even for fast-moving waveforms. Furthermore, there is a strong need in the art for a method and apparatus for displaying compressed data representing overlapping images. In addition, there is a strong need for a method and apparatus which better enables a viewer to distinguish overlapping images and, in particular, overlapping waveforms on an oscilloscope display. Even further, there is a strong need for such an apparatus and method whereby a display is produced which better resembles a display on a real-time oscilloscope.

SUMMARY OF THE INVENTION

The display resolution enhancement system of the present invention provides a means for prioritizing and displaying overlapping images on a display based on the intensity levels of each respective image with respect to each other. According to a preferred embodiment, the display resolution enhancement system produces a bit map for each respective image for controlling a display, where each value in the bit map represents the intensity of a corresponding display element on the display for forming the respective image. The values in each of the bit maps corresponding to the same display element are summed together to produce a composite digital intensity value representative of the overlapping images at that particular display element. Each composite digital intensity value is used to control the intensity of the corresponding display element on the display and, as a result, overlapping images such as waveforms can still be easily distinguished even where such images overlap. Each composite digital intensity value can be selected to be related linearly or non-linearly to the actual intensity of the corresponding display element on the display.

According to a color embodiment of the present invention, each image to be displayed is identified by a different color. For each display element on the display, the color of that display element is set to be the color of the image with the highest intensity for that display element. The intensity of the display element can be the sum of the bit map intensity values of the individual images which it overlays. Alternatively, for example, the intensity of the display element can be that of the individual image having the brightest bit map intensity value at that particular display element.

According to another embodiment of the present invention, a display enhancement apparatus for displaying digital data representing a plurality of images is provided, comprising a display having a plurality of addressable display elements with independently adjustable intensity levels; means for compressing said digital data to produce respective bit maps representative of said images, each of said bit maps including digital intensity values which are each representative of an intensity level of a corresponding one of said display elements; overlapping data processing means for combining according to a predetermined criteria said digital intensity values from said respective bit maps which correspond to the same display element so as to generate a corresponding composite digital intensity value for each of said display elements; and means for adjusting the intensity level of each of said display elements in accordance with said corresponding composite digital intensity value.

According to still another, embodiment of the present invention, a display enhancement apparatus for displaying digital data representing a plurality of images is provided, comprising a color display having a plurality of addressable display elements with independently adjustable color and intensity levels; means for processing said digital data to produce respective bit maps representative of said images, each of said bit maps including digital intensity values which each are representative of an intensity level of a corresponding one of said display elements; overlapping data processing means for combining according to a predetermined criteria said digital intensity values from said respective bit maps which correspond to the same display element so as to generate a corresponding composite digital intensity value for each of said display elements; and means for adjusting the intensity level of each of said display elements in accordance with said corresponding composite digital intensity value.

According to still another embodiment of the present invention, a display enhancement apparatus for displaying digital data representing a plurality of images is provided, comprising a display having a plurality of addressable display elements with independently adjustable intensity levels; means for compressing said digital data to produce respective sets of digital intensity values representative of said images, each of said digital intensity values being representative of an intensity level of a corresponding one of said display elements; overlapping data processing means for combining according to a predetermined criteria said digital intensity values from said respective sets which correspond to the same display element so as to generate a corresponding composite digital intensity value for each of said display elements; and means for adjusting the intensity level of each of said display elements in accordance with said corresponding composite digital intensity value.

According to still another embodiment of the present invention, a display enhancement apparatus for displaying digital data representing a plurality of overlapping images is provided, comprising means for calculating a data activity level for each of said images; and means for displaying said images on a display, whereby in areas where two or more of said images overlap on said display said areas exhibit an optical characteristic of the image having the lowest of said data activity levels.

To the accomplishment of the foregoing and related ends, the present invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIGS. 4a–4d provide a schematic representation of a display resolution enhancement technique using compressed data in accordance with the present invention;

FIG. 5a is an operational flowchart of the data compression portion of the display enhancement processor of the present invention according to an exemplary embodiment;

FIG. 5b is a memory map for the display enhancement processor memory for storing multiple channels of compressed data, with each channel representing a separate image;

FIGS. 6a–6d provide a schematic representation of the formulation of an intensity control instruction and partial bit map in accordance with the present invention;

FIG. 10a is a block diagram of a color embodiment of the display enhancement processor according to the present invention;

DESCRIPTION OF THE PREFERRED EMBODIMENTS

Figure 1A:
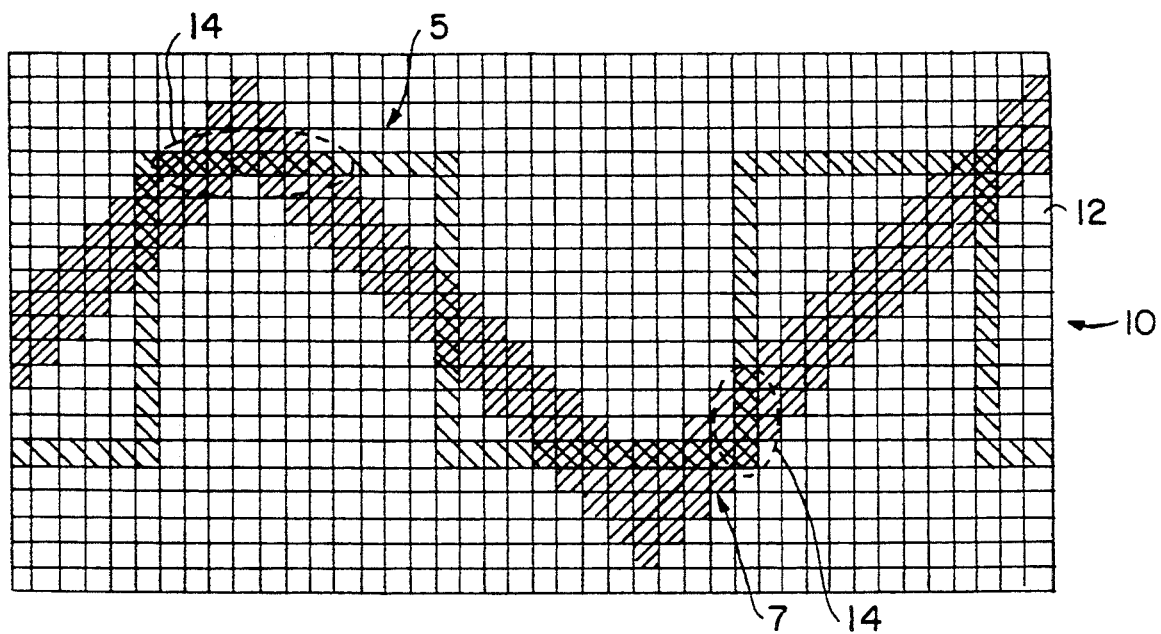
FIGS. 1a–1c are displays of overlapping waveforms using conventional data display techniques.
Figure 1B:
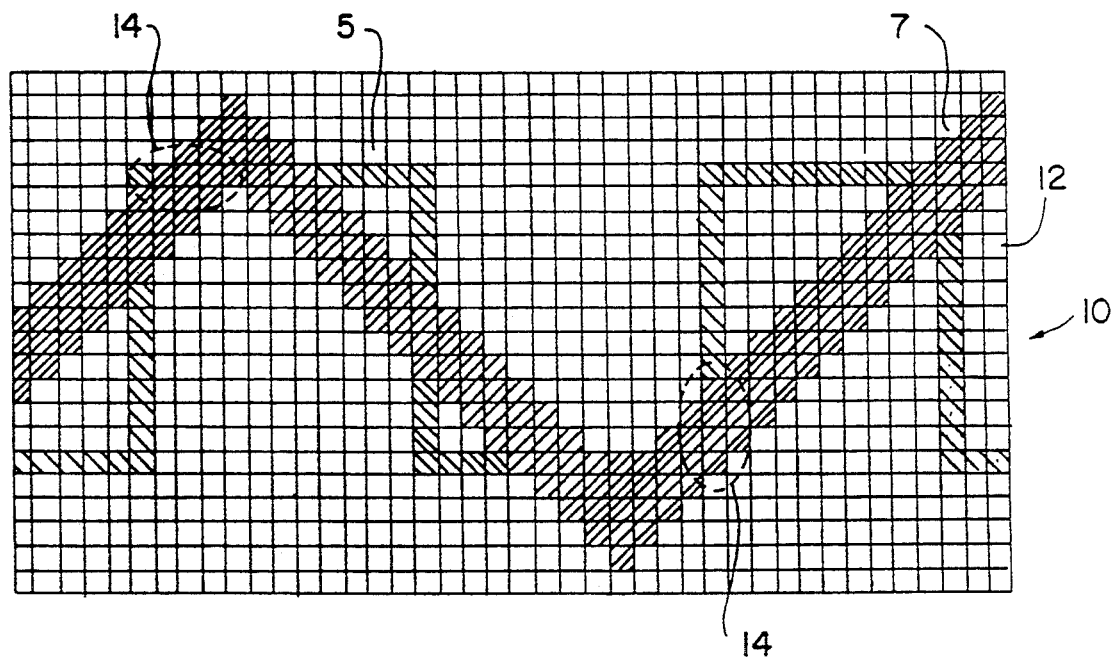
Figure 1C:
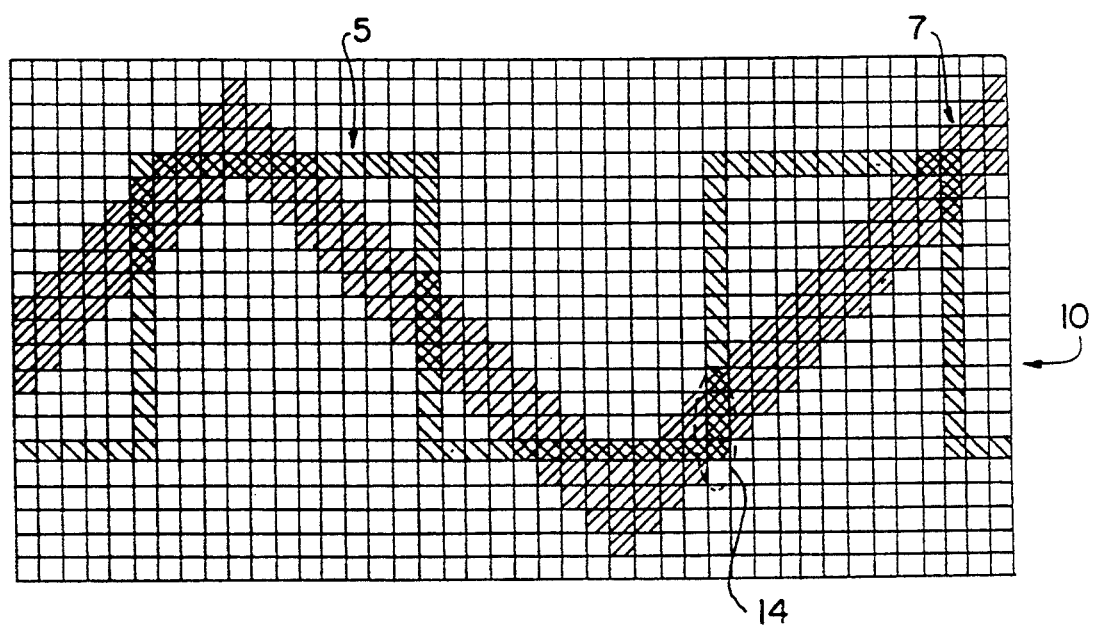

The present invention will now be described with reference to the drawings wherein like reference numerals are used to refer to like elements throughout.

Figure 2A:
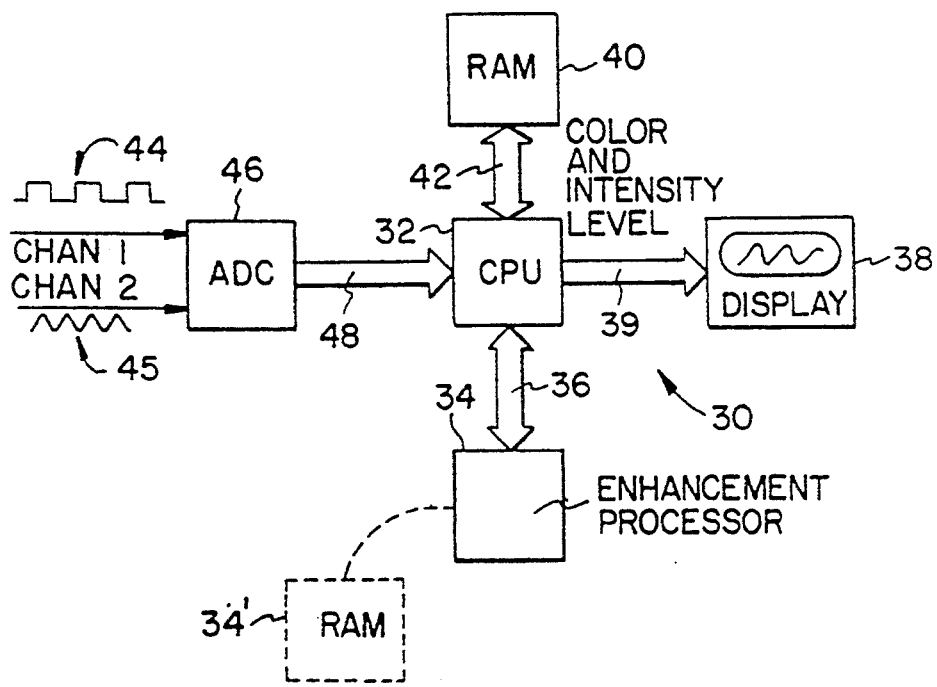
FIG. 2a is a block diagram of a display resolution enhancement system in accordance with the present invention.

Referring initially to FIG. 2a, a block diagram of display resolution enhancement system 30 is shown in accordance with the present invention. The system 30 includes a central processing unit (CPU) 32 which provides for overall control within the system. The CPU 32 is coupled to an enhancement processor 34 via a control/data bus 36. The enhancement processor 34 is used to compress and to process the data to be displayed. The enhancement processor 34 generates a set of control instructions based on the processed data in the form of a series of composite digital intensity values. Such control instructions are provided to the CPU 32 via the bus 36. Each control instruction represents one or more optical characteristics of the compressed data. The CPU 32 uses the control instructions to drive an information display 38 via a bus 39 in order that two or more overlapping images will be displayed on the information display 38. The system 30 and information display 38 can be part of an oscilloscope, for example. It will be noted, however, that although the present invention is described herein primarily in the context of a display resolution enhancement system for a raster display, the present invention is equally suited for use with virtually any type of information display, particularly of the type having addressable display elements (e.g., pixels) where the intensity of each display element can be set independently as will be appreciated.

The data to be displayed includes a plurality of data points or data values ("data points" and "data values" being used interchangeably herein). The data is preferably digital data stored in a memory such as a random access memory (RAM) 40 which is connected to the CPU 32 by way of a bus 42. The data stored in the RAM 40 represents any two or more electronically stored images such as a waveform, computer-assisted drawing, video image, alpha-numeric characters, etc. The images overlap in the sense that when the data values representing each particular image are displayed on the display 38, one or more display elements are representative of at least two or more of the images.

The image data stored in the RAM 40 is accumulated therein using conventional techniques. For example, in a multi-channel embodiment the data can be the result of analog waveforms 44 and 45 being sampled and digitized via a CHAN1 and a CHAN2 input using an analog-to-digital converter (ADC) 46. The digitized data representing the analog waveforms 44 and 45 is output from the ADC 46 and serves as an input to the CPU 32 via a bus 48. The CPU 32 stores the data representing the analog waveforms 44 and 45 in the RAM 40 separately via the bus 42 according to conventional memory storage techniques.

The data points stored in the RAM 40 need not be limited to the actual sampled data values from the analog waveforms 44 and 45. Additional data values may be obtained via interpolation, etc., between the sampled data values. Alternatively, the data values stored in the RAM 40 may be computer generated by the CPU 32 for example. Regardless of how the data stored in the RAM 40 is obtained initially, the present invention is concerned primarily with the display of such data as such data represents overlapping images on the information display 38. While the invention is described in the context of a two-channel embodiment, it will be appreciated that the same inventive concepts apply for any number of channels, with each channel supplying data representative of a corresponding image.

Typically, the data points to be displayed on the information display 38 from each channel will be a function of at least two parameters. If the data stored in the RAM 40 represents analog waveforms, for example, the data points will typically be a function of amplitude versus time. In a different application such as the display of health related data, the data points may be a function of population versus height, for example. It will be appreciated that the data can be a function of other parameters without departing from the scope of the invention. The system 30 will be described hereinafter primarily with respect to the display of data representing overlapping waveforms 44 and 45. However, it will be appreciated that the system 30 can be used to display data points representing other types of overlapping images such as video images. In addition, it will be appreciated that the data stored in the RAM 40 need not come from the ADC 46, but can come from any source of image data. In fact, the CPU 32 can be used to generate and/or provide image data directly to the enhancement processor 34, thus bypassing the RAM 40 as will be appreciated. Moreover, while the system 30 is described herein primarily with respect to a vertical scan raster display 38, it will be appreciated that the same inventive concepts apply for a horizontal scan raster display as well as other types of information displays.

Figure 2B:
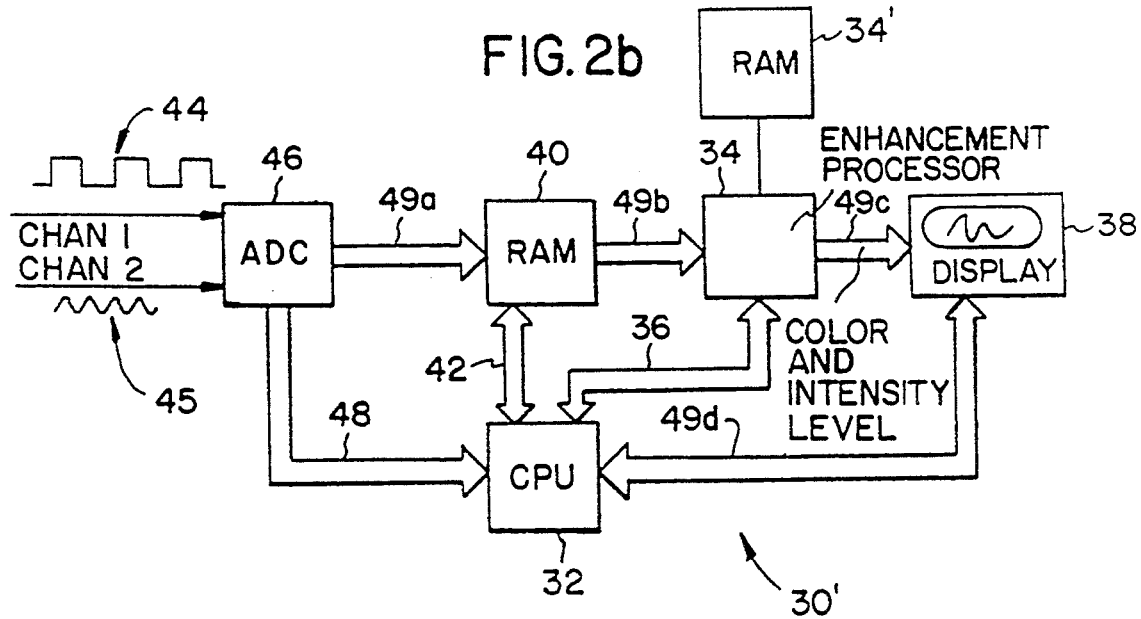
FIG. 2b is a block diagram of another embodiment of a display resolution enhancement system in accordance with the present invention.

FIG. 2b illustrates an alternate embodiment of the display resolution enhancement system which is designated 30'. In this particular example, the digitized data from the ADC 46 is input directly into the RAM 40 via a bus 49a rather than via the CPU 32. The enhancement processor 34 receives the digitized data directly from the RAM 40 via a bus 49b; and control instructions are sent directly from the enhancement processor 34 to the information display 38 via bus 49c. The CPU 32 controls the ADC 46, RAM 40, enhancement processor 34 and information display 38 via busses 48, 42, 36 and 49d, respectively. The embodiment of FIG. 2b represents primarily a hardware based system, whereas the embodiment of FIG. 2a can be predominantly software driven as will be appreciated. While the embodiment of FIG. 2b will typically be faster, the embodiment of FIG. 2a generally will have a lower cost.

Figure 3A:
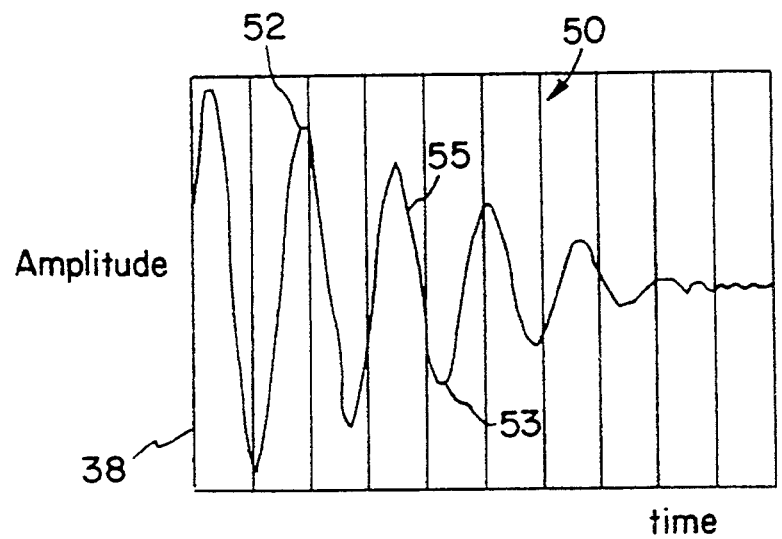
FIG. 3a is a display of a waveform without display resolution enhancement.
Figure 3B:
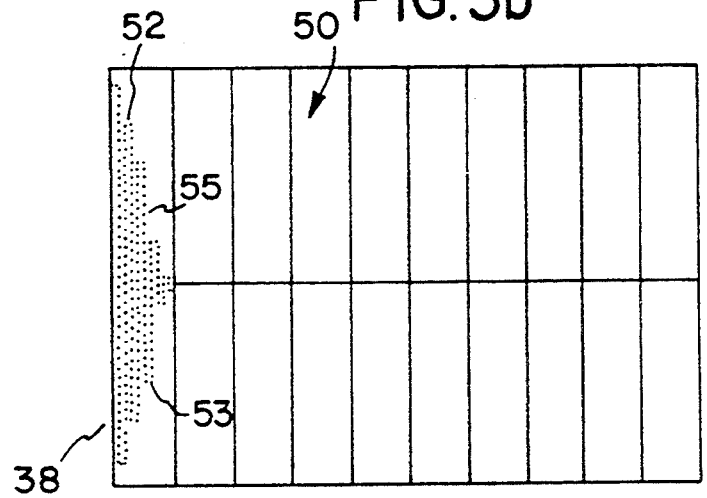
FIG. 3b is a display of the waveform of FIG. 3a with data compression and display resolution enhancement in accordance with the present invention.

The display resolution enhancement operation of the present invention will be described initially with respect to FIGS. 3a–3c and 4a–4c. To better illustrate the operation of the present invention, the system 30 will be described primarily with respect to a single image or waveform and how the data are processed to provide enhanced resolution. Data for additional images or waveforms will be processed in the exact same manner so that ultimately the images can be combined and displayed on the display 38 using overlapping techniques as is described in detail further below. Referring now to FIG. 3a, a generic waveform 50 represented by data points stored in the RAM 40 is shown as it would appear on the information display 38 without any enhancement. The generic waveform 50 can be any waveform such as the waveform 44 or 45, and is intended to serve merely as an example. FIG. 3b illustrates the waveform 50 after the data in the RAM 40 has been compressed 10:1 in accordance with the present invention.

As will be appreciated based upon the description below, during the compression of the data stored in the RAM 40, the system 30 determines the local maximum and minimum data values in the waveform 50 so as to retain the positive and negative peaks in the waveform 50 as is shown in FIG. 3b. In addition, the system 30 processes the data to develop a set of control instructions in the form of composite digital intensity values for controlling intensity, which are used to drive the information display 38. In the preferred embodiment, the greater the number of data points that are compressed for display on a given pixel or display element, the brighter that pixel or display element will be based on such control. This is evident in FIG. 3b at the peaks 52 and valleys 53 of the waveform 50 where the intensity of the pixels representing the waveform 50 is increased. At the steeper, sloped portions of the waveform 50, such as along the edge 55, the respective pixels have a lower intensity which results in that portion of the waveform being dimmer as is shown.

Figure 3C:
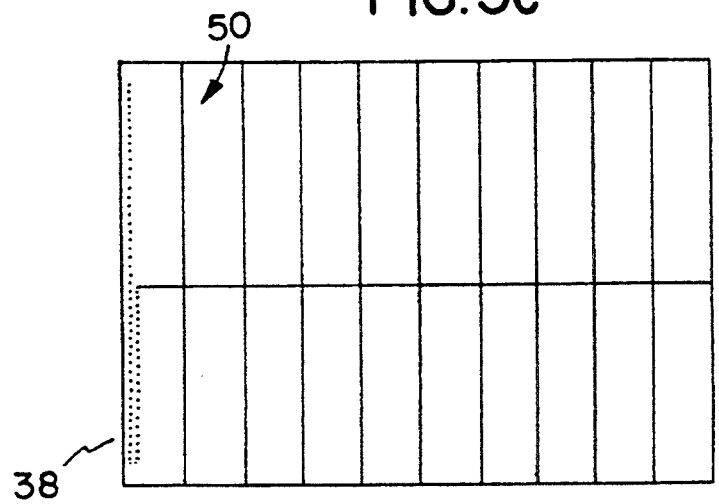
FIG. 3c is a display of the waveform of FIG. 3b with additional data compression in accordance with the present invention.

Notably, the visual effect exhibited in FIGS. 3b and 3c is the same visual effect that occurs in a real time oscilloscope with a vector scan display. At slow timebase speeds relative to the frequency of the input signal, the vertical excursions of the waveform occur with relatively little horizontal motion. As a result, the display elements on the real time oscilloscope display are re-traced and will appear brighter. At faster timebase speeds, the vertical excursions of the waveform occur with relatively greater horizontal motion, thus resulting in the display elements not being retraced and therefore appearing dimmer.

FIGS. 4a–4d provide a graphical representation of how the system 30 preferably compresses and enhances the display data for each of the waveforms stored in the RAM 40. FIG. 4a shows only a portion 50' of the waveform 50, although the following process can be applied repeatedly across the entire waveform as will be appreciated. The vertical lines shown in FIG. 4a represent the sampling times of the ADC 46. In FIG. 4b, the sampled data values D1–D10 are shown, these sampled data values being the data values which would be stored in the RAM 40. The horizontal lines 52 in FIG. 4b have been added to represent the relative amplitudes of the data values. The data values D1–D10 are stored in the RAM 40 as is mentioned above, preferably in temporal or contiguous order, along with the other data values representing the remainder of the waveform 50.

In this particular example, it is desired that the system 30 compress and display waveform 50' by a ratio of 10:1. FIG. 4c graphically represents such a compression of the waveform 50' with a series of three closely spaced vertical lines. The leftmost vertical line extends from the amplitude level of the data value D1 to the amplitude level of the data value D3, the data value D3 representing a local maximum. The center vertical line in FIG. 4c extends from the amplitude level of the data value D3 to the next in time local minimum at the amplitude level of the data value D7. The rightmost vertical line in FIG. 4c extends from the data value D7 to the next in time local maximum represented by the amplitude level of the data value D10. Accordingly, each of the vertical lines shown in FIG. 4c represent the range of data values extending between a successive maximum and minimum data value.

FIG. 4d represents how the waveform 50' would actually appear on the information display 38 according to the present invention. Because of the 10:1 compression ratio, the display of the ten data values D1–D10 appears as a single vertical line 50" extending from the minimum value of the data value D7 to the maximum value of the data value D10. However, the intensity of the respective display elements or pixels forming the vertical line 50" varies as a function of the degree of overlap of the three vertical lines shown in FIG. 4c. For example, the vertical line 50" is formed of pixels having the highest intensity between the amplitude range defined by the data values D1 and D3, which is the range where all three of the vertical lines in FIG. 4c overlap. The vertical line 50" is formed of pixels displaying a medium intensity in the range defined by the data values D1 and D7, which is the range where only two of the vertical lines in FIG. 4c overlap. The vertical line 50" is formed of pixels exhibiting the lowest intensity in the range defined by the data values D3 and D10, which is the range where only one of the vertical lines in FIG. 4c exists.

Thus, FIG. 4d illustrates graphically how the system 30 of the present invention is able to display compressed data while retaining useful information such as the local maximum and minimum excursions of the waveform. The variations in the intensity of the displayed waveform portion represented by the vertical line 50" permits the viewer to discern a local minimum 55 and local maximum 56. If a real time oscilloscope (RTO) were to display the waveform 50' at the same compression ratio of 10:1, the real time oscilloscope would produce a vertical trace with the same appearance as the waveform 50". The RTO would trace a portion of the compressed waveform three times (between D3 and D1), others (near the bottom) only twice, and a small peak at the top of the compressed waveform only once. As a result, the display of the RTO would appear as a vertical trace with three levels of intensity.

It will be appreciated that several more data values representing the remainder of the waveform 50 can be compressed in the same manner for the same or different horizontal display positions on the information display 38 in order to display an entire waveform 50 such as that shown in FIGS. 3b or 3c. By processing the data values stored in the RAM 40 as described above in order to determine the degree of overlap between the data value ranges defined by the local maximum and minimum data values in the waveform, a bit map representing the compressed waveform can be generated as is described in more detail below. In the case of overlapping images, the bit map values for each image or waveform are combined by the enhancement processor 34 using the overlapping techniques of the present invention to form a set of composite digital intensity values. The set of composite digital values is delivered by the CPU 32 to the information display 38 (FIG. 2a) to produce the compressed data display described herein representing overlapping images. Alternatively, in the embodiment shown in FIG. 2b, the set of composite digital intensity values is delivered directly from the enhancement processor 34 to the information display 38 as will be appreciated.

In the example described above with respect to FIGS. 4a–4d, the relative intensity of the pixels (or display elements in the case of a vector scan display, for example) forming the displayed waveform is described as being a function of the overlap of the data value ranges between local maximum and minimum values; however, the relative intensity of the pixels can also be described according to another predetermined criteria. For example, the pixel intensity can be described as a function of the local density of the compressed data. As is shown in FIGS. 4a–4d, when the data values D1–D10 are compressed, there is a higher density, e.g., number of data values, in the range defined by the amplitudes of the data values D1 and D3. Similarly, the densities of the data values in the ranges defined by the amplitudes of the data values D1 and D7, and D3 and D10, are lower and lowest, respectively.

Referring now to FIG. 5a, a system flowchart is shown for the above-described data compression operation of the system 30. The system 30 is predominantly software driven such that the CPU 32 performs the various steps shown in FIG. 5a. For each image or waveform, the data points stored in the RAM 40 are stored preferably in temporal order, e.g., D1, D2, D3, . . . , DT, where T represents the total number of data points. In addition, the data points for each image are grouped in the RAM 40 in M groups of L contiguous data points, where $M \times L = T$.

The enhancement processor 34 in this particular embodiment includes a RAM 34' (shown in FIGS. 2a and 2b) such as an SRAM, DRAM, or some other type of memory which can be, for example, a portion of the RAM 40. Referring briefly to FIG. 5b, the RAM 34' is divided (notionally) into M blocks 60 for each channel of image data (e.g., CHAN 1 and 2). Each block 60 corresponds to a group of contiguous data points stored in the RAM 40, and adjacent blocks 60 correspond to contiguous groups of the data points stored in the RAM 40 for each respective image. In the exemplary embodiment in which the data is to be compressed relative to the horizontal (time) axis of the information display 38, the number M of blocks 60 corresponds to the number M of horizontal positions on the information display 38.

Each block 60 includes N memory locations 62, the number of memory locations 62 corresponding to the vertical resolution of the data to be displayed. Thus, the RAM 34' includes an $M \times N$ memory array for each image and can store information representative of an entire frame for each image corresponding to the $M \times N$ information display 38, where M is equal to the horizontal resolution and N is equal to the vertical resolution. For each image or channel of data, the respective addresses of each memory location 62 are denoted by $P_{m,n}$ which corresponds directly to a display element position on the information display 38.

Referring again to FIG. 5a, the compression operation for a given channel of data is described. In step 68 the digital data is stored in the RAM 40 from the ADC 46, for example, as is described above. In step 70, the system 30 is initialized such that all memory locations $P_{m,n}$ in the respective blocks 60 are set to "0". In step 72, the values of m and t are initially set to "1", m representing a particular block 60 and t representing the particular data point in the sequence of data stored in the RAM 40 for the particular image. For a compression ratio of L:1, L+1 data points are read from the RAM 40 in sequence for each of the M horizontal positions on the information display 38. As a result, each group of L contiguous data points stored in the RAM 40 will be compressed as follows.

The CPU 32 will read the data values from the RAM 40 in temporal order, e.g., D1, D2, . . . DT. The CPU 32 proceeds to map the data values to the corresponding $M \times N$ memory array in the RAM 34' utilizing line drawing techniques to identify the overlap of line segments or ranges of data values based on the data values acquired from the RAM 40. Thus, in step 74 the CPU 32 determines whether $t = mL + 1$ which, would indicate the end of a group of data. If not, the system 30 proceeds to step 76 where the next ordered data point $D_t$ is read from the RAM 40. In step 78, the CPU 32 compares successive data values $D_{t-1}$ (representing the previous data point in the sequence) and $D_t$ in the group. If the successive data values $D_t$ and $D_{t-1}$ are compared in step 78 and the value of $D_{t-1}$ is less than the value of $D_t$, then the two data points describe a line which is sloping upwards. If the successive data values $D_{t-1}$ and $D_t$ are compared in step 78 and the value of $D_{t-1}$ is greater than or equal to the value of $D_t$, then the two data points describe a line which is sloping downwards or is horizontal. Thus, lines between successive data points $D_t$ and $D_{t-1}$ can be described in this manner. However, as successive data points are evaluated it will be appreciated that if the next data point $D_{t+1}$ in what had been a non-decreasing series of data values $D_{t-1}$ and $D_t$, for example, were to be less than the previous data value $D_t$, then the data values $D_{t-1}$, $D_t$ and $D_{t+1}$ are describing two lines which overlap.

According to this particular embodiment of the invention, such an overlap of lines is displayed using values which are mapped or otherwise written to the RAM 34' to produce a set of digital intensity values which can be used to increase or decrease the intensity of a vertical display line produced on the information display 38 as a result of a vertical memory scan of the corresponding block 60 progressing from the lowest to highest address in the block 60. Thus, for example, if $D_{t-1}$ is determined to be less than $D_t$ in step 78, a "+1" is added by the CPU 32 (step 80) to the memory location $P_{m,n=x(t-1)}$ in the corresponding block 60, x{t−1} representing the value of $D_{t-1}$. In addition, the CPU 32 adds a "−1" to the memory location $P_{m,n=x(t)+1}$ in the corresponding block 60, x{t} representing the value of $D_t$. Thus, if the block 60 (designated by m) were to be vertically scanned from the lowest to highest address, the "+1" would indicate the beginning of the line segment joining the data values $D_{t-1}$ and $D_t$, and the "−1" would indicate the end of the line segment.

Following step 80, the system 30 proceeds to step 81 where t is incremented by one so that the next pair of successive data values in the group m is compared.

If, in step 78, the CPU 32 determines that $D_{t-1}$ is greater than or equal to $D_t$ (indicating a downwardly sloping or horizontal line segment), the CPU 32 adds a "−1" to the memory location $P_{m,n=x(t-1)+1}$ as is shown in step 82. Furthermore, the CPU 32 adds a "+1" to the memory location $P_{m,n=x(t)}$. Again, the "+1" and "−1" indicate, respectively, the beginning and end of the line segment joining the two data values, provided the block 60 is to be scanned vertically from the lowest to highest address. The system thereafter proceeds to step 81. It will be noted that the decrementing of a memory location $P_{m,n}$ corresponding to the greater of the two data values $D_t$ and $D_{t-1}$ occurs where n is equal to the greater data value plus one, rather than the position where n is simply equal to the greater data value. If the data values $D_t$ and $D_{t-1}$ are equal, $P_{m,n}$ is decremented, where n equals the value of $D_{t+1}$. This "addition" of one to the value of n is a result of the RAM 34' being scanned vertically from the lowest to highest address. In order to ensure that the line segment represented by the "+1" and "−1" includes the actual value of both data points, the "−1" (signalling the end of the line segment) is stored in the next higher memory location $P_{m,n}$ in the block 60.

The system 30 then returns to step 74 and the next pair of successive data values are compared as described above. As a result, the line segments between successive pairs of data values $D_t$, $D_{t-1}$ in the group m are determined and a series of "+1"s and "−1"s are accumulated in the respective memory locations in the corresponding block 60. The accumulated values in each block 60 represent the extent of overlap of the line segments and the relative intensity levels for a vertical scan line can be derived from the contents of the block as described below.

If t is equal to mL+1 in step 74, thus indicating that the last data value in the particular group has been compared, the CPU 32 proceeds to check in step 84 to determine if there is additional data to be read. If t is not yet equal to ML+1 in step 84, the system 30 proceeds to step 86 where m is incremented so as to begin the formation of the next set of digital intensity values in the next corresponding block 60. In step 88, the CPU 32 begins to read another group of data values from the RAM 40. In particular, the CPU reads the next two data points in the sequence, $D_{t-1}$ and $D_t$, respectively. The above described process is then repeated beginning with step 78. If there is no more data to be read from the RAM 40 for a given image or channel, as determined in step 84 when t=ML+1, the system 30 proceeds to step 90 whereby the compression operation is completed. The process shown in FIG. 5a is then repeated for each additional image or channel of data values. The CPU 32 can be programmed to perform all of the above steps and procedures using conventional programming techniques as will be appreciated by those having ordinary skill in the field of programming.

An exemplary application of the method shown in FIG. 5a is represented graphically in FIGS. 6a–6c. The group of data which is to be compressed 4:1 consists of data values D1'–D4' whose relative values are related to their corresponding height as shown in FIG. 6a. FIG. 6a includes the line segments 90–92 (also referred to herein as the range of data values) formed between the successive pairs of data values D1'–D2', D2'–D3', and D3'–D4', respectively. The value of the data point D1' is less than that of the data point D2' and, as a result, a "+1" is added to the memory location $P_{m,n}$ in a block 60 corresponding to the value of the data point D1' as is represented in the column designated D1'–D2' in FIG. 6b. In addition, a "−1" is added to the memory location $P_{m,n}$ which corresponds to the value of the data point D2' as is shown in the same column. It will be noted that for the theoretical example presented in FIGS. 6a–6d, the "−1" is added to the memory location corresponding to the value of the larger data, not the data value "plus one" as in steps 80 and 82 in FIG. 5a. Otherwise, the procedure is identical to that shown in FIG. 5a. In practice, the "−1" is added preferably to the memory location $P_{m,n}$ corresponding to the larger data value "plus one" to ensure that the larger data value is included in a vertical scan from bottom to top of the block 60 as will be appreciated.

Comparing the next pair of successive data points D2' and D3', it can be seen that the value of D2' is greater than D3'. Therefore, a "−1" is added to the memory location $P_{m,n}$ corresponding to the value of D2' and a "+1" is added to the memory location $P_{m,n}$ corresponding to the value of D3' as is represented in the column designated D2'–D3' in FIG. 6b. Finally, the next pair of successive data points D3' and D4' are compared wherein the value of D3' is less than that of D4' as is shown in FIG. 6a. As a result, a "+1" is added to the memory location corresponding to the value of D3' and a "−1" is added to the memory location corresponding to the value of D4' as is shown in the column designated D3'–D4' in FIG. 6b.

Accordingly, the group of data points D1'–D4' are mapped sequentially to the block 60. The CPU 32 adds the "+1" and "−1" pair to the corresponding memory locations $P_{m,n}$ in the block for each line segment formed by the successive data points in the group. The additions of the "+1"s and "−1"s are accumulated in each particular memory location $P_{m,n}$ such that after all the successive data pairs in the group have been compared, the contents of the block 60 will be as that shown in FIG. 6c.

After each group of data has been compressed in this manner into the corresponding block 60 in the RAM 34', the contents of each block 60 are accumulated by the CPU 32 to form a bit map representative of the compressed data for the respective image or channel. Each value in the bit map represents the intensity of a corresponding display element on the information display 38. The procedure is most easily explained graphically with respect to FIGS. 6c and 6d. Beginning at the bottom of the block 60 in FIG. 6c (which corresponds to the bottom of the information display 38 at a respective horizontal position), the accumulated output is initially zero and the corresponding intensity of the vertical trace is zero as shown in the partial bit map 60' shown in FIG. 6d. Thereafter, the "+1" in the memory location $P_{m,n}$ corresponding to the value of the data point D1' is encountered during a vertical scan of the block 60 and is accumulated to produce an output equal to 1 which corresponds to a display intensity on the information display 38 of a "level 1". The vertical trace remains at the "level 1" intensity, as represented by each value in the bit map 60', until the "+2" value is encountered in the memory location corresponding to the value of the data point D3'. The accumulated output is incremented by two and is representative of an intensity on the information display 38 of a "level 3" as is shown in the corresponding bit map value in FIG. 6d. The vertical trace will remain at the "level 3" intensity until the "−2" value is encountered in the memory location in the block 60 corresponding to the value of the data point D2'. As a result, the accumulated output is decremented by two as is shown in the corresponding bit map 60' value, and the accumulated output represents the intensity of the vertical trace on the information display 38 being reduced to a "level 1". The vertical trace then remains at the "level 1" until the "−1" is encountered in the memory location corresponding to the value of the data point D4'. The accumulated output is decremented by one, or back to zero, such that the intensity of the vertical trace will return to zero as is shown in the bit map 60' of FIG. 6d.

Figure 6E:
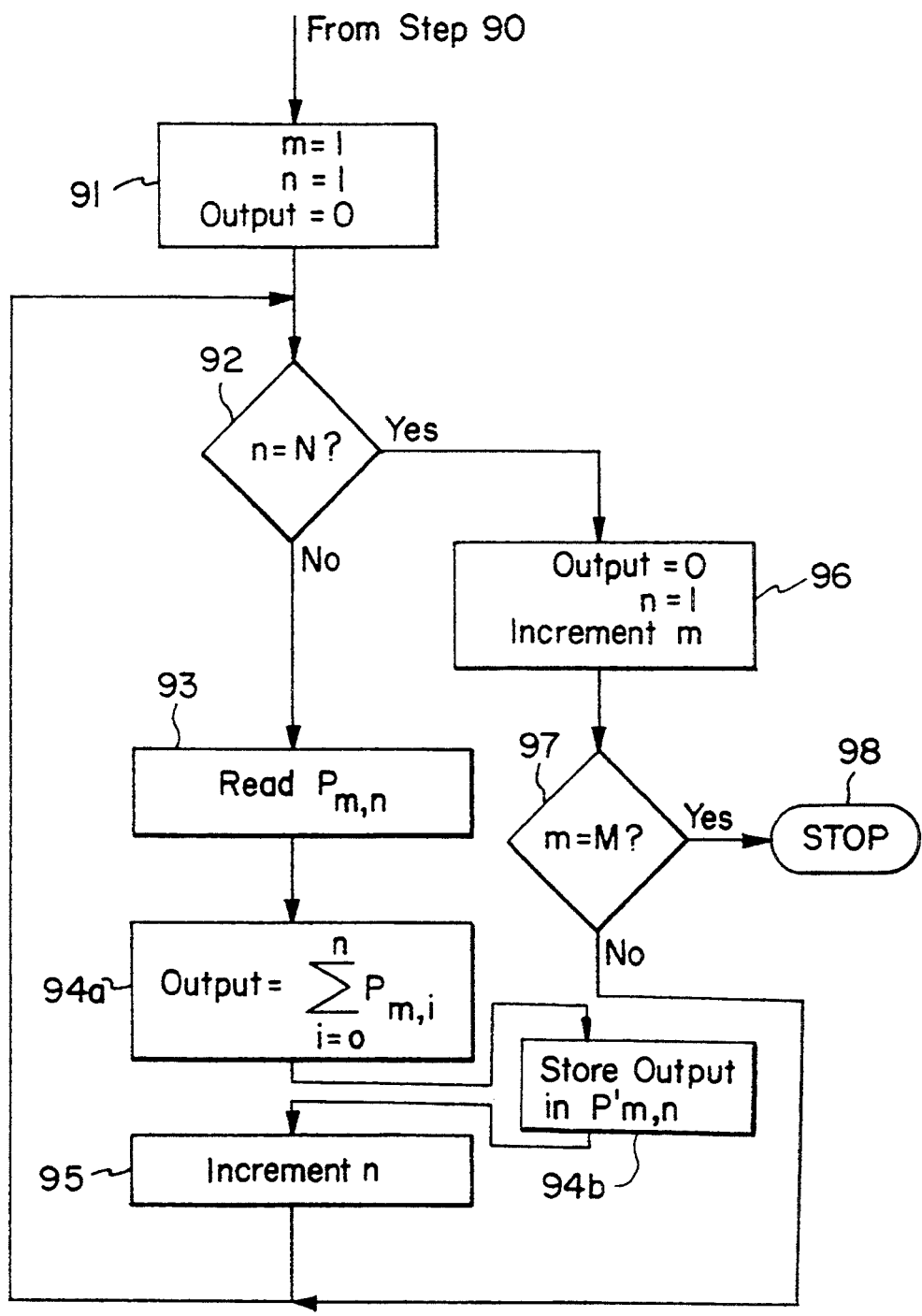
FIG. 6e is a flowchart illustrating an output operation for generating a bit map representative of the respective display element intensities for each image according to the present invention.

FIG. 6e provides a flowchart illustrating the above-described procedure for producing a bit map 60' for each of the channels of data. The particular output procedure shown in FIG. 6e produces a bit map 60' for an entire display frame on the information display 38 by repeating the above-described procedure for each block 60. The bit map 60' can be stored in conventional memory such as an available portion of the memory 40 or RAM 34'; alternatively, the bit map 60' can be generated within the same corresponding M×N memory array in the RAM 34' as a result of a series of read-modify-writes as will be appreciated. After the bit maps 60' for each of the channels of compressed data have been produced, the bit maps are combined using an overlapping technique to produce a set of composite digital intensity values for displaying the overlapping images as is described with respect to FIGS. 7 and 10.

As the process shown in FIG. 6e is identical for each channel of data, the process will be described only with respect to a single channel. In step 91, the system 30 is initialized whereby m and n are set equal to "1" and the accumulated output is zeroed. The data values stored in the RAM 34' for a given channel are then read by the CPU 32 in the following manner. In step 92 the system 30 determines whether n is equal to N, thus indicating the last, or highest, $P_{m,n}$ value in a block 60 corresponding to the value of m. If not, the value of $P_{m,n}$ is read from the RAM 34' (step 93) and is accumulated with the previous $P_{m,n}$ values stored in the block 60 (step 94a) to produce an "output" value. This output value, which represents a digital intensity value, is then stored at a corresponding memory location $P'_{m,n}$ in the bit map 60' (step 94b). The value of n is incremented in step 95, and the system 30 returns to step 92.

If in step 92 n is equal to N, the system 30 process to step 96 where m is incremented, n is set equal to "1", and the "output" value is reset to zero for the start of another vertical trace for the next horizontal position on the information display 38. In step 97 it is determined whether m is equal to M, thereby indicating that all the values for a given channel have been read from the RAM 34' to generate a bit map 60' for a complete display frame. If yes, the system 30 proceeds to step 98 and exits the output routine of FIG. 6e. If m is not equal to M in step 97, the system 30 proceeds to step 92 whereby the next portion of the bit map 60' is generated in the same manner described above.

Figure 7:
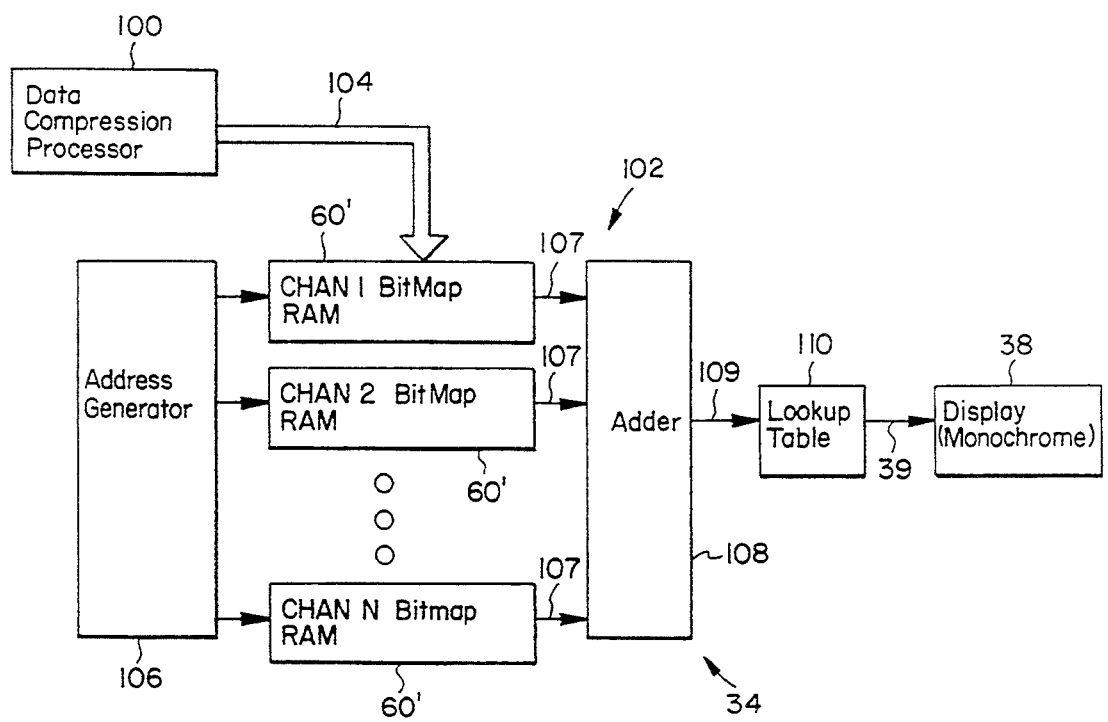
FIG. 7 is a block diagram of a monochrome embodiment of the display enhancement processor according to the present invention.

Referring now to FIG. 7, a detailed block diagram of an exemplary embodiment of the enhancement processor 34 is shown. The enhancement processor 34 in this particular embodiment is for a monochrome information display 38. The enhancement processor 34 includes a data compression processor 100 and an overlapping data processor 102. The data compression processor 100 is responsible for carrying out the data compression techniques described above with respect to FIGS. 5a and 6e for each channel of data values. As will be appreciated, the data compression processor 100 can be implemented primarily through software using known computer programming techniques. Thus, further detail is not provided.

The data compression processor 100 generates the contents of the bit map 60' for each corresponding channel of image data based on the values accumulated in the corresponding blocks 60. In the preferred embodiment, the bit map 60' will be for an entire display frame on the information display 38. However, it will be appreciated that each bit map 60' may in fact represent only a portion of the information display 38 such as a vertical scan segment (as in FIG. 6d). In this manner multiple bit maps 60' for each channel may be processed sequentially for each horizontal position on the information display 38.

The data compression processor 100 stores the contents of each of the respective bit maps 60' in a random access memory (RAM), for example, via a bus 104 as shown. The overlapping data processor 102 includes an address generator 106 connected to each of the bit maps 60'. The address generator 106 generates the address $P'_{m,n}$ for each digital intensity value stored in the bit maps 60' corresponding to a display element. The digital intensity value stored in each bit map 60' for that particular display element is read from the respective bit map 60' onto line 107 and is input to a digital adder 108. The digital adder 108 then adds the digital intensity values for all of the channels to generate a composite digital intensity value for controlling the intensity of the corresponding display element on the display 38.

Figure 8A:
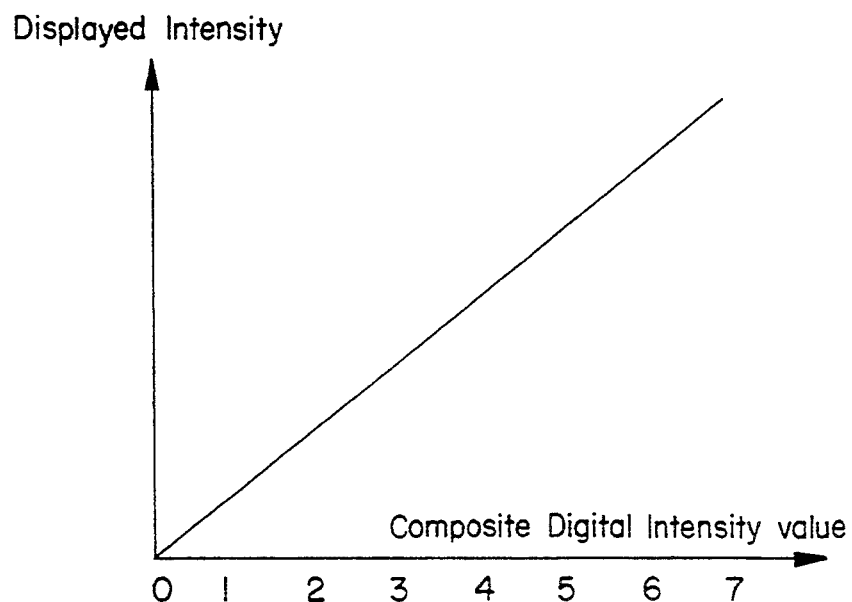
FIGS. 8a and 8b represent a linear and non-linear mapping, respectively, of a composite digital intensity value and displayed intensity in accordance with the present invention.
Figure 8B:
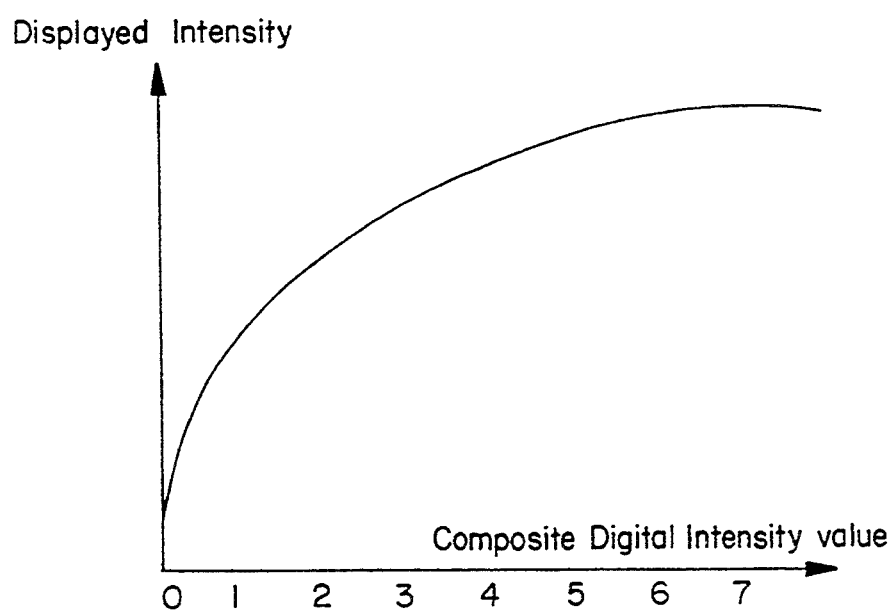

The composite digital intensity value corresponding to each display element is outputted from the composite digital adder 108 on line 109 and is input to a lookup table 110. The lookup table 110 performs an intensity level mapping from the digital intensity value to the displayed intensity on the display 38. Such mapping can be linear as is shown in FIG. 8a, or non-linear as is shown in FIG. 8b. Non-linear mapping has been found to be particularly useful when there is significant variation in the intensities of the respective images. The lookup table 110 is included in the preferred embodiment to convert the composite digital intensity value to a form suitable to drive the display 38. In the case of the information display 38, the composite digital intensity value is convened through a digital-to-analog converter (DAC) to provide the appropriate analog intensity input as each raster scan is performed. For a liquid crystal display, for example, the digital output from the lookup table 110 can be used directly as the intensity input for each respective display element. The output from the lookup table 110 can be delivered directly to the display 38 in an embodiment such as that shown in FIG. 2b; alternatively, the output from the lookup table 110 can be provided to the display 38 via the CPU 32 in an embodiment such as that shown in FIG. 2a.

Figure 9:
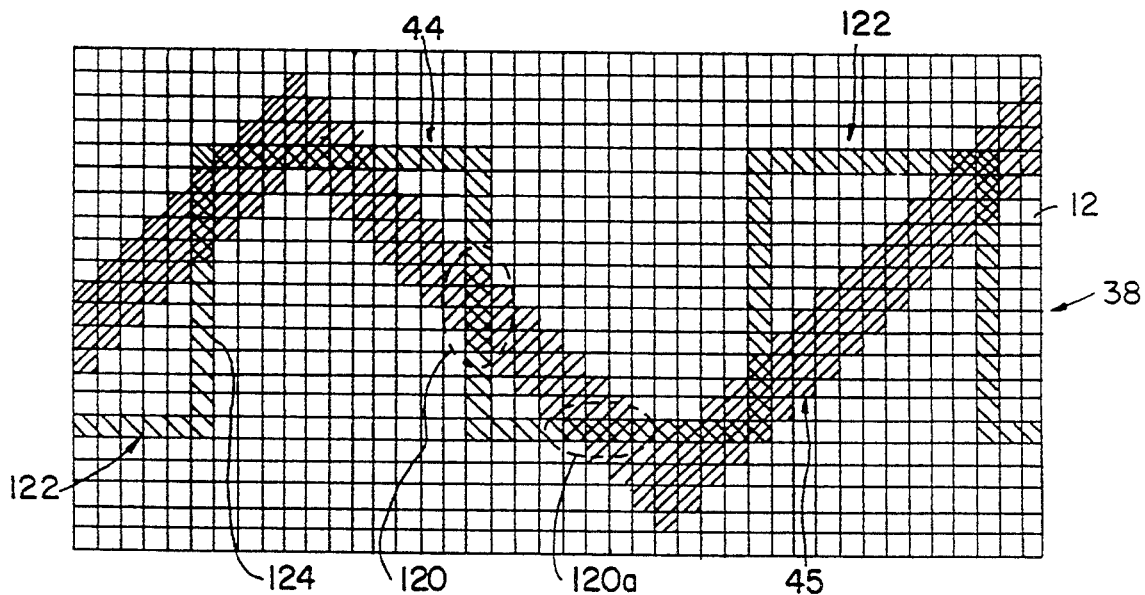
FIG. 9 represents a display of overlapping waveforms in accordance with a monochrome embodiment of the present invention as is shown in FIG. 7.

The display enhancement processor 34 accesses each of the intensity values in the respective bit maps 60' corresponding to each display element via the address generator 106 and generates a corresponding composite digital intensity value representing the sum of the intensities of all of the images to be displayed. The advantage of performing such summation is that each of the images can be more readily distinguished, even where the respective images overlap. For example, FIG. 9 illustrates the waveforms 44 and 45 (FIG. 2a) displayed on a monochrome display 38 in accordance with the embodiment of FIG. 7. In the areas 120 consisting of the display elements 12 where the respective waveforms overlap, the intensity of each of the display elements 12 is represented by the sum of the corresponding digital intensity values for the respective waveforms 44 and 45. Thus, the display elements 12 in the areas 120 of overlap appear brighter, thereby making the individual waveforms more distinguishable.

In addition, it will be noted that the intensity of the respective display elements 12 is varied in the waveform 44 to exemplify the above-described data compression. Along the top and bottom portions 122 of the squarewave 45, the waveform is relatively slow moving and results in there being a larger local density of data values being compressed thereat according to the procedure described in FIG. 5a. The edges 124 of the squarewave 45, on the other hand, are faster moving and this results in a smaller local density of data values being compressed at the edges. As a result, the display elements 12 representing the top and bottom portions 122 of the squarewave 45 will have a higher digital intensity value associated therewith and will appear brighter than the edges 124 as is shown. The overlapping data processor 102 (FIG. 7) utilizes the higher digital intensity values, which result from such data compression as described above, when summing the corresponding digital intensity values of each waveform. As a result, the present invention produces an enhanced display of overlapping images as is shown in FIG. 9.

Referring now to FIG. 10a, another embodiment of the display enhancement processor 34 is shown for use with a color information display 38 in particular. According to the embodiment of FIG. 10a, each channel of data is identified by a different color (e.g., Logical Color 1, Logical Color 2, ..., Logical Color n). For example, the image represented by the data on CHAN 1 (e.g., waveform 44 in FIG. 2a) is identified on the display 38 by the color red, the image represented by the data on CHAN 2 (e.g., the waveform 45 in FIG. 2a) is identified by the color orange, etc. The particular color assigned to each channel can be virtually any color producible on the display 38.

Figure 10B:
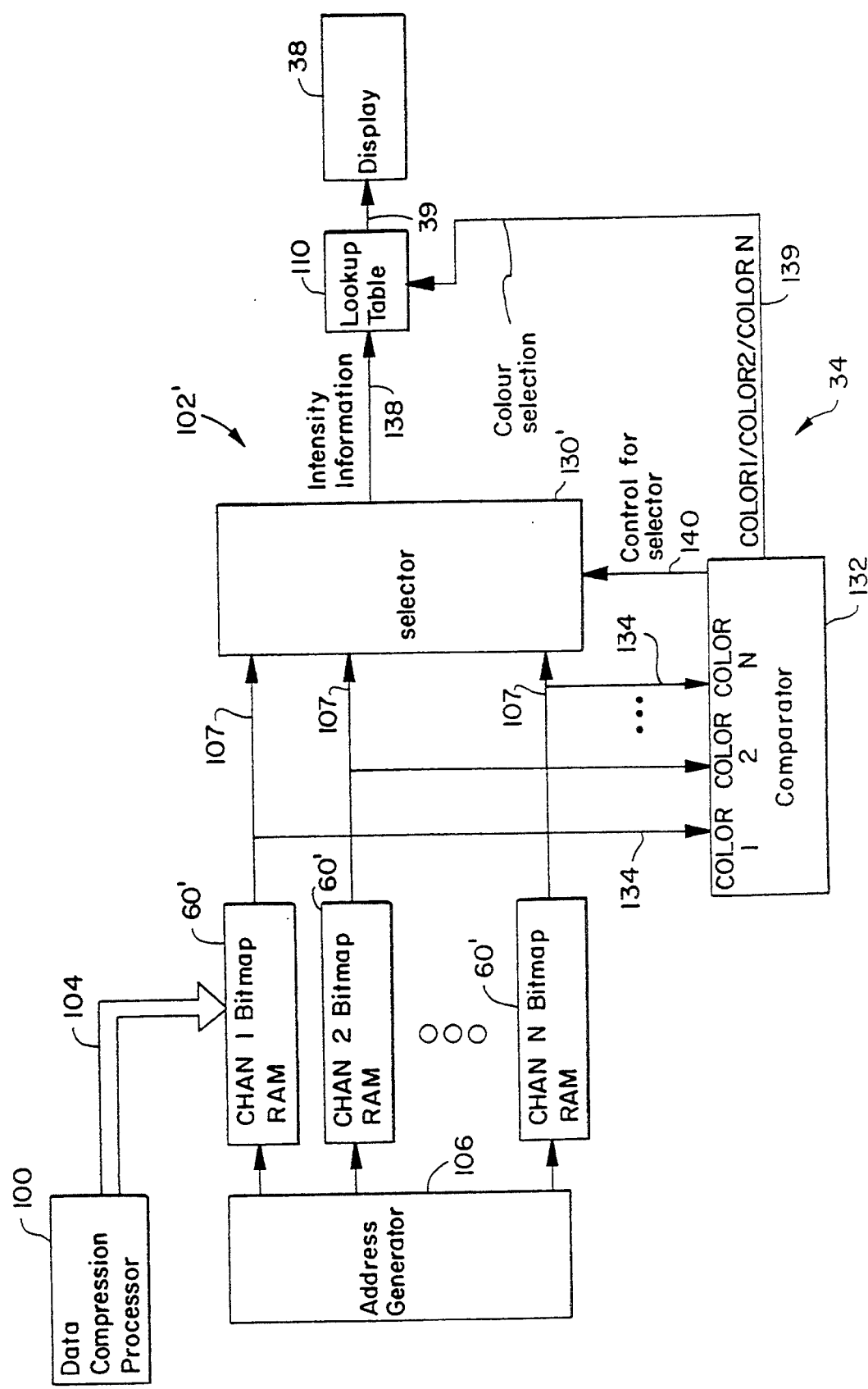
FIG. 10b is a block diagram of another color embodiment of the display enhancement processor according to the present invention.

For each display dement 12 on the display 38 in FIG. 10a, the color of that display element is determined by the overlapping data processor 102' to be the color of the image or channel of data with the highest digital intensity value corresponding to that particular display element 12. The intensity of that particular display element can be the sum of the corresponding digital intensity values from the bit maps 60' as in the embodiment of FIG. 7. Alternatively, the intensity of the display element can be selected to be that represented by the highest of the corresponding digital intensity values as is described below with reference to FIG. 10b.

Describing now the embodiment of FIG. 10a in more detail, the data compression processor 100, address generator 106, and bit maps 60' are identical in function as described above with respect to the embodiment of FIG. 7. The overlapping data processor 102' in the color embodiment includes a digital adder 130 coupled to the data outputs of the bit maps 60' via the lines 107. In addition, the overlapping data processor 102' includes a comparator 132 for comparing the digital intensity values received from each bit map 60' via lines 134.

As the address generator 106 generates the address (i.e., $P'_{m,n}$) corresponding to each display element, the digital adder 130 receives the digital intensity values corresponding to that particular display element 12 from each bit map 60'. The corresponding digital intensity values from each bit map 60' are added together to produce a composite digital intensity value on line 138. In addition, the comparator 132 determines which of the digital intensity values from the bit maps 60' corresponding to that particular display element is highest via the lines 134. In turn, the comparator 132 provides a control signal on line 139 indicative of the color associated with the channel having the highest digital intensity value. The control signal on line 139 serves as an input to the lookup table 110 which maps the composite digital intensity value on line 138 to the displayed intensity of the corresponding display element in the color identified on line 139. Again, such mapping can be linear or non-linear as exemplified in FIGS. 8a and 8b. As a result, the corresponding display element 12 on the display 38 will be displayed with an intensity based on the sum of the display values for each channel or image and in the color corresponding to the channel having the highest intensity. The color control implemented via the lookup table 110 can be the result of mapping the appropriate red-green-blue (RGB) information to the display 38 using conventional techniques. In the case of a raster-type display 38, three DACs are utilized to provide three analog voltages for the RGB information as is conventional.

FIG. 10b represents yet another embodiment of the display enhancement processor 34 for use with a color information display 38. The embodiment shown in FIG. 10b is identical to that shown in FIG. 10a with the following exceptions. In the embodiment of FIG. 10b, the digital adder 130 is replaced by a digital selector 130' for use in selecting the highest of the corresponding digital intensity values provided on the input lines 107. More particularly, the comparator 132 again is used to determine the highest display intensity value from the bit maps 60' via the lines 134. The comparator 132 produces a control signal on line 140 which is indicative of the channel having the highest display intensity value for the display element corresponding to the address identified by the address generator 106. The control signal on line 140 is input to the digital selector 130'. The digital selector 130' functions as a conventional multiplexer to route the highest of the display intensity values on lines 107 onto line 138 as the composite digital intensity value. The signal on line 140 serves as the selector input to the multiplexer.

As in the previous case represented in FIG. 10a, the comparator 132 determines which channel includes the highest display intensity value via lines 134 for each corresponding display element 12. The comparator 132 provides the control signal to the lookup table 110 via line 139 such that the display element 12 will be displayed in the color identified with the channel having the highest display intensity value.

Figure 11:
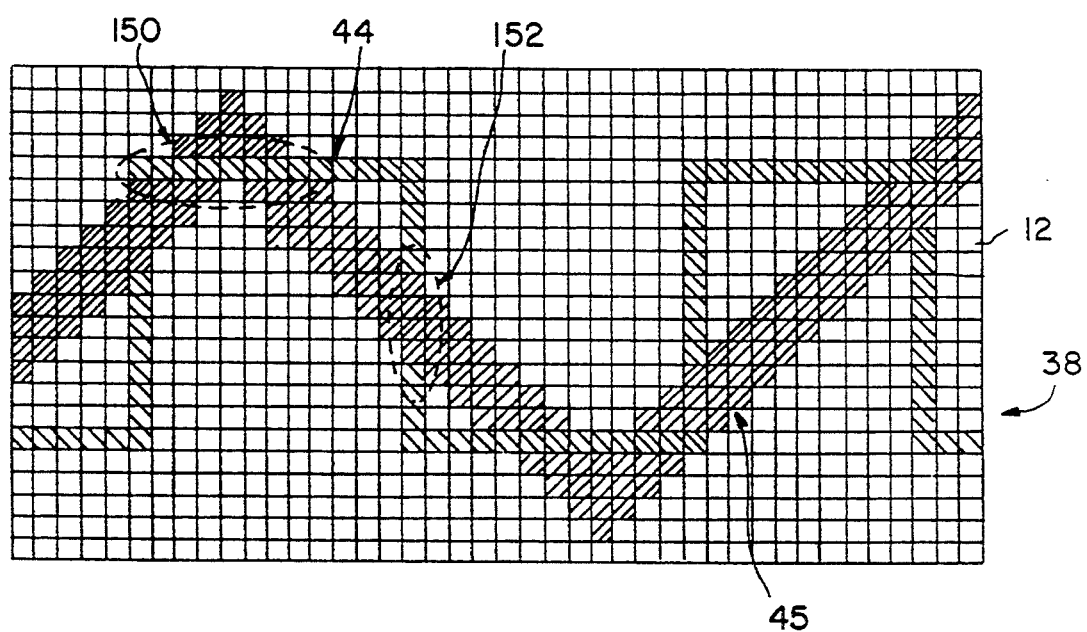
FIG. 11 is a display of overlapping waveforms in accordance with a color embodiment of the present invention as is shown in FIG. 10.

Referring now to FIG. 11, an exemplary color display of the waveforms 44 and 45 is shown. The shading direction shown in each display element 12 indicates the respective color of the display elements, and the boldness of the shading represents the intensity as in the other figures. In the display 38 as is shown in FIG. 11, the intensity of each display element 12 is selected by the digital selector 130' to correspond to that of the channel having the highest intensity value as is described above with respect to FIG. 10b. Thus, in the area of overlap 150 where the waveform 44 has the highest intensity, the display elements 12 exhibit the intensity and color of the waveform 44. However, in the area of overlap 152, the waveform 45 has the highest intensity. Therefore, the display elements 12 in the area 152 exhibit the intensity and color of the waveform 45. This technique has the effect of bringing slowly moving waveforms or portions thereof (as the slowly moving portions are brighter when the data has been compressed), to the front of the display 38 where the waveform can be seen, and where the waveform overwrites the waveform having the faster moving areas (as these are dimmer).

Figure 12:
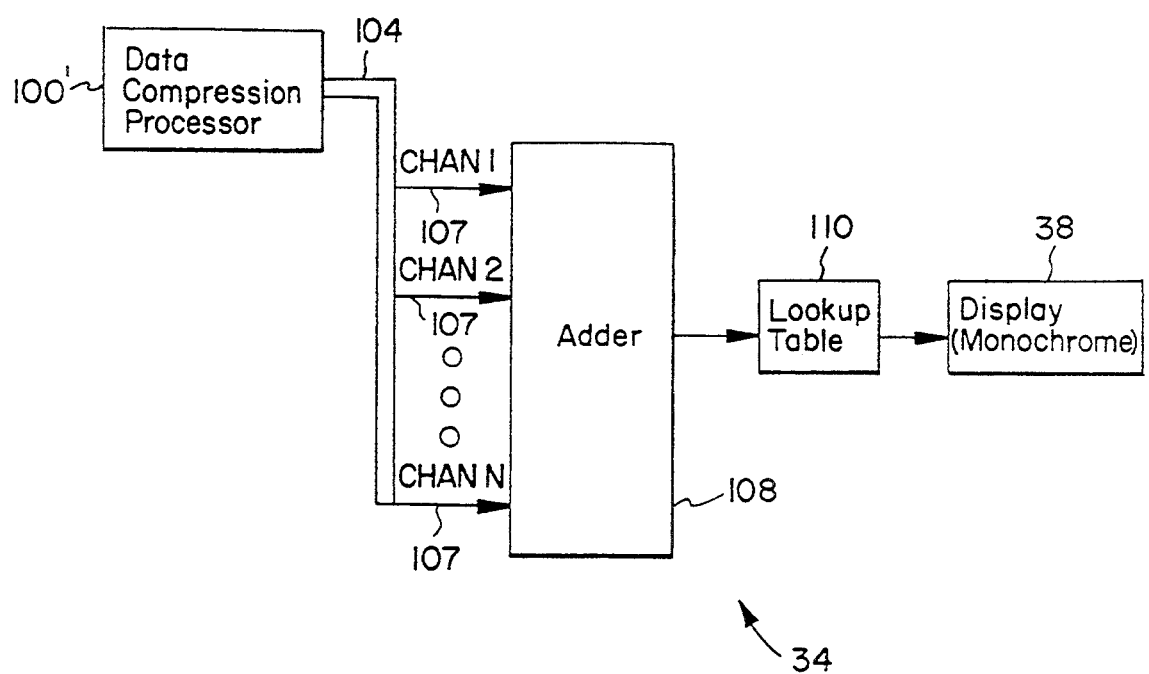
FIG. 12 is a block diagram of another monochrome embodiment of the display enhancement processor according to the present invention.

Although the invention has been shown and described with respect to certain preferred embodiments, it is obvious that equivalents and modifications will occur to others skilled in the art upon the reading and understanding of the specification. For example, FIG. 12 shows yet another embodiment of the enhancement processor 34. In the embodiment of FIG. 12, it is not necessary to actually store a full or partial bit map 60' in RAM for the respective images. Instead, the data compression processor 100' is modified so as to provide the corresponding "output" or digital intensity values generated in step 94a (FIG. 6e) for each respective channel directly to the inputs of the digital adder 108 via bus 104 and lines 107. Thus, step 94b in FIG. 6e is eliminated and step 95 follows step 94a directly. As a result, the digital adder 108 generates a composite digital intensity value for controlling the intensity of the corresponding $P_{m,n}$ display element on the display 38 based on the respective digital intensity values as such digital intensity values are generated in step 94a for each channel. This eliminates the need for the bit map 60' RAMs and the address generator 106 shown in FIG. 7.

Moreover, although FIG. 12 represents a monochrome embodiment, it will be appreciated that the same concepts discussed above apply to a color embodiment. For example, the digital intensity values generated in step 94a (FIG. 6e) can be input directly into the adder 130 (FIG. 10a) or the selector 130' (FIG. 10b) in order to generate the composite digital intensity values for the color display 38.

Figure 13:
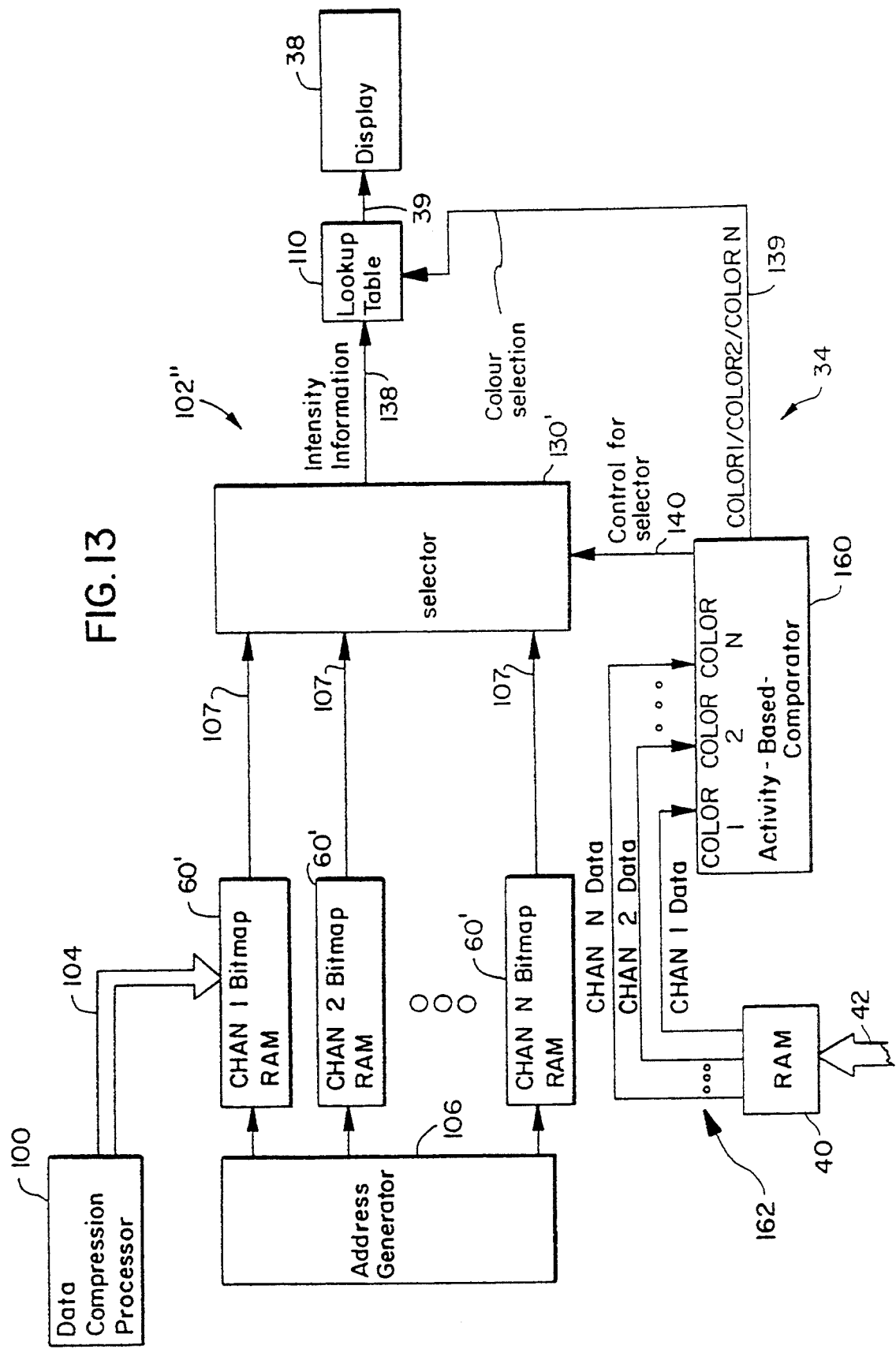
FIG. 13 is a block diagram of still another color embodiment of the display enhancement processor according to the present invention.
Figure 14:
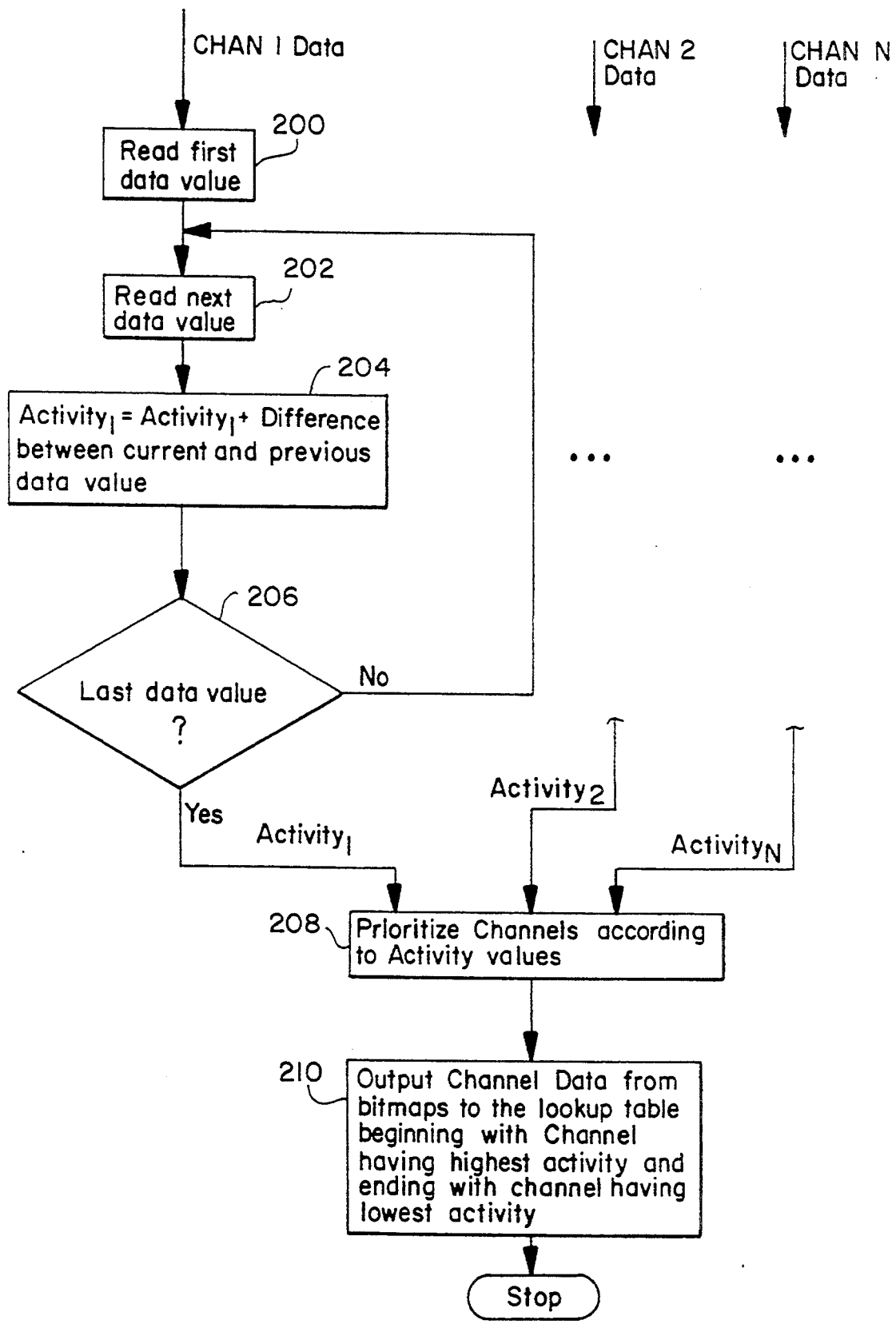
FIG. 14 is a flowchart describing the operation of the enhancement processor of FIG. 13 according to the present invention.

Briefly referring to FIGS. 13 and 14, and initially to FIG. 13, yet another embodiment of the enhancement processor 34 for use with a color information display 38 is shown. In this particular embodiment, an activity level is determined for each channel of image data. The images are then prioritized so that the images with the lowest activity levels overwrite the images with the higher activity levels. In the case where the images each represent a waveform on an oscilloscope, for example, the activity level for each waveform is based on the total excursion of the waveform over the entire display 38. This makes the slower moving waveforms more visible, as will be appreciated, and avoids them getting obliterated by waveforms with a lot of activity.

More particularly, the enhancement processor 34 as shown in FIG. 13 includes an overlapping data processor 102'' which comprises the selector 130' controlled by an activity-based comparator 160. The remaining elements in the enhancement processor 34 are identical to those discussed with respect to the embodiment of FIG. 10b for example.

The activity-based comparator 160 receives as inputs the original uncompressed image data stored in the RAM 40, with each channel of data being input on a respective line 162, for example. Each channel of data is identified as before with a corresponding logical color (e.g., Logical Color 1, Logical Color 2, etc.). The activity-based comparator 160 receives the data from the RAM 40 for each channel in temporal order, and the activity level for each channel of data is calculated by the activity-based comparator 160 as described below with respect to FIG. 14. After the activity level for each channel of data has been calculated, the activity-based comparator 160 prioritizes the respective channels of data from highest activity level to lowest activity level. Thereafter, the activity-based comparator 160 outputs a control signal on line 140 causing the digital selector 130' to route the digital intensity values stored in the bit map 60' corresponding to the channel having the highest activity level through to the display 38 via line 138 and the lookup table 110. At the same time, the activity-based comparator 160 provides a control signal on line 139 which identifies the color corresponding to that particular channel for appropriate mapping by the lookup table 110. The address generator 106 steps through the sequence of addresses for an entire display frame and, as a result, the image with the highest activity level is displayed first on the information display 38 in its corresponding color.

The above process is then repeated for the channel of data having the next to highest activity level, and so on, until ultimately the channel of data having the lowest activity level is displayed on the display. For each channel of data, the activity-based comparator 160 provides the corresponding control signals on lines 139 and 140. As a result, the image represented by the data in the corresponding bit map 60' will be displayed in the corresponding color. In this manner, in the areas where the image represented by a channel of data having a lower activity level overlaps an image represented by a channel of data having a higher activity level, the display elements on the display 38 will be overwritten based on the digital intensity value and color associated with the channel having the lower activity level. This has the effect of bringing the image with the lower activity level to the front of the display when using a digital storage oscilloscope, for example. Note that it may be desirable to include a zero-detect in the lookup table 110 such that a digital intensity value equal to zero for a channel having lower activity level does not overwrite a non-zero displayed intensity resulting from a non-zero digital intensity value associated with a channel having a higher activity level.

As was previously stated, the activity levels of the channels of data in the exemplary embodiment are based on the excursion of the respective waveform or image over the entire display 38. FIG. 14 illustrates an exemplary procedure for determining the respective activity levels, although it will be appreciated that various other techniques can be employed. In FIG. 14, beginning in step 200 the activity-based comparator 160 receives the image data for each channel. It will be noted that because the procedure is identical with respect to each channel, the procedure will be described herein primarily only with respect to CHAN 1.

In step 200, the first data value (e.g., D1 of FIG. 4b) is read from the RAM 40 via line 162 (FIG. 13). In step 202, the next data value (e.g., D2 of FIG. 4b) is read from the RAM 40. In step 204, the value of the variable "Activity$_1$" is calculated based on the previous value of "Activity$_1$" (initially set to zero) plus the absolute difference between the current data value (e.g., D2) and the previous data value (e.g., D1).

In step 206, the activity-based comparator 160 determines if the last data value for the particular channel has been retrieved from the RAM 40. If not, the process returns to step 202 where the next data value is read and the value of "Activity$_1$" is updated (step 204). After the last data value has been encountered in step 206 for each of the respective channels of data, the activity-based comparator 160 proceeds to step 208 where the channels of data are prioritized based on the corresponding activity level values "Activity$_1$", "Activity$_2$", . . . , "Activity$_n$" calculated in steps 200 to 206. Specifically, in step 208 the channels of data are prioritized nominally from the channel having the highest activity level to the channel having the lowest activity level.

In step 210, the activity-based comparator 160 causes the respective channel data from the bit maps 60' (FIG. 13) to be outputted to the display 38 as described above. More particularly, the data from the bit map 60' corresponding to the channel having the highest activity level is initially written to the display 38. Thereafter, the data from the bit map 60' corresponding to the next to highest activity value is written to the display 38, and so on. Thus, the image with the highest activity level is placed at the back of the display 38 (i.e., is "drawn" first) and the image with the lowest activity level is placed at the front (drawn last).

The embodiment of the present shown in FIGS. 13 and 14 can be implemented primarily via hardware, software, or both as will be appreciated. Moreover, it will be appreciated that other techniques may be utilized for determining the activity levels of the respective channels of data without necessarily departing from the scope of the invention. For example, the activity level may be based on the minimum and maximum excursion levels of the compressed data for each block 60 of compressed data as is represented in FIG. 6c, for example. For the block of compressed data shown in FIG. 6c, the activity level can be based on the absolute difference between the values of D4' and D1', which are the respective maximum and minimum excursion levels for that particular block 60. The absolute difference between the maximum and minimum excursion levels for each block 60 are added together for all M blocks for a channel of data in order to obtain an activity level for the respective channel of data. The minimum and maximum excursion levels for each group of data compressed into a block 60 can be determined using conventional means such as a minimum-maximum detector as will be appreciated.

It will be appreciated that the present invention can be used with any addressable display where the intensity and/or color of a display element can be set independently. Such displays include raster, LCD, gas plasma, electroluminescent, vector scanned, and color shutter displays. Moreover, while the invention is described primarily in the context of compressing the image data on each channel to determine intensity information based on local density, it will be appreciated that data compression is not necessary to performing the overlapping techniques described herein. Rather, the combination of data compression techniques and overlapping techniques have been described herein for the reason that such combination has been found to produce optimum results when displaying multiple waveforms on an oscilloscope. However, the intensity information for each individual waveform or image could come from a source other than data compression, e.g., such as utilizing a digitizing scope camera to obtain digital intensity information for an image.

Figure 15:
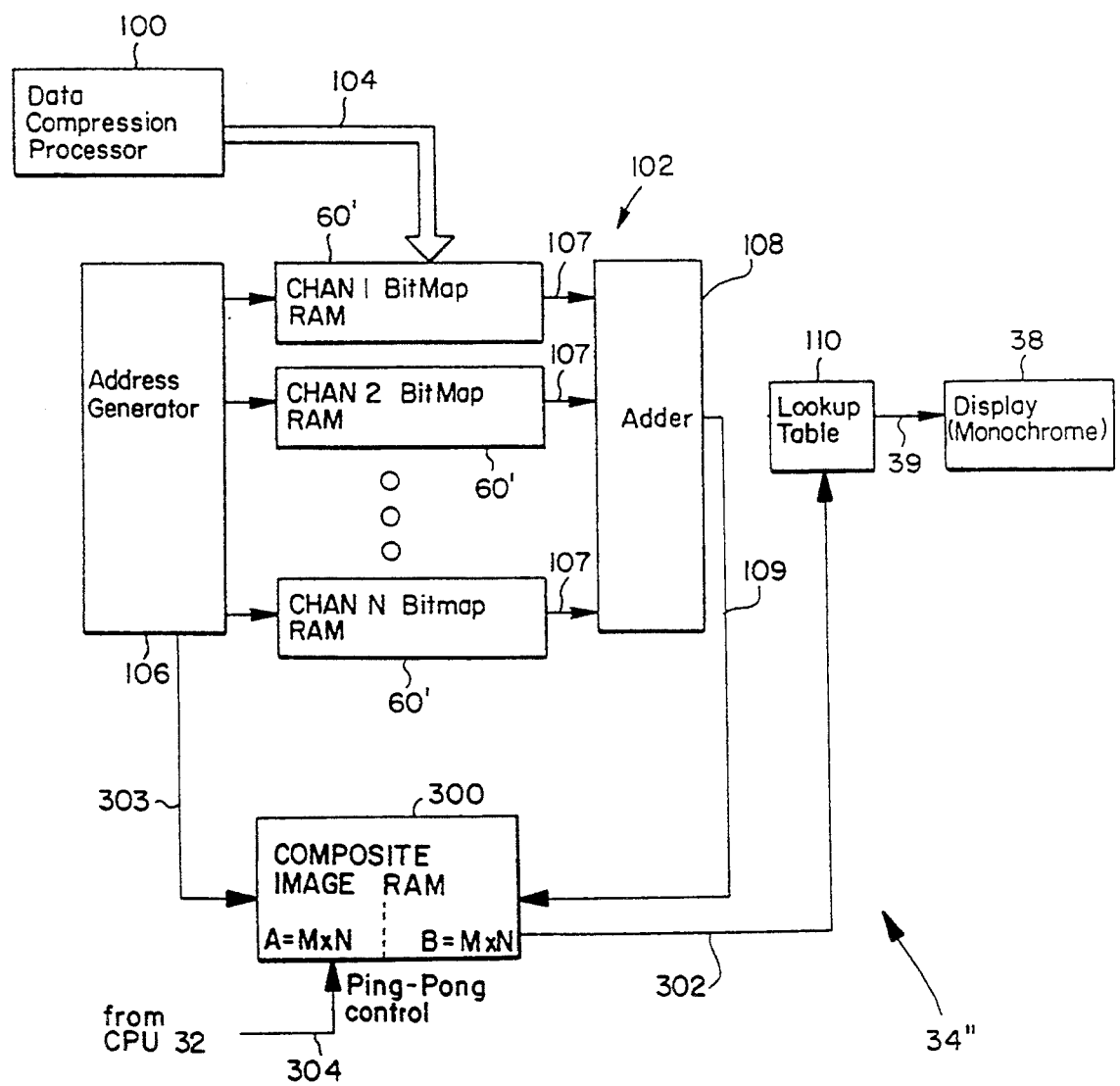
FIG. 15 is a block diagram of a monochrome embodiment of the display enhancement processor in which processed data is stored in memory for display at a later time according to the present invention.

It will be further appreciated the invention as described herein can be carried out using a variety of other digital techniques for outputting the composite digital intensity values to the display. For example, FIG. 15 shows a modified embodiment of the enhancement processor of FIG. 7, which is designated generally 34". In the embodiment of FIG. 15, the composite digital intensity values produced on line 109 at the output of the adder 108 are inputted and stored in a composite image RAM 300 for display at a later time (relative to a substantially immediate display as in the previous embodiments).

In the exemplary embodiment, the composite image RAM 300 is subdivided into RAM portions A and B which are each capable of storing the composite digital intensity values for an entire display frame. The RAM portions A and B are accessed according to a conventional ping-pong buffering scheme, e.g., a complete display frame is built up in the RAM A portion while the display frame stored in the RAM B portion is displayed, via line 302 and the lookup table 110, on the display 38, and vice versa. The address generator 106 is used to provide the corresponding addresses via line 303 to the composite image RAM 300 for storing and retrieving the composite digital intensity values from the RAM 300. Control according to the ping-pong buffering scheme can be provided to the RAM 300 from the CPU 32 via line 304 as will be appreciated.

Storing the composite digital intensity values in the RAM 300 for display at a later time is particularly useful in situations where the hardware and/or software carrying out the above-described compression/overlapping techniques is relatively slow, and therefore requires more time to process data for display on the display 38. Furthermore, it will be appreciated that although the use of the composite image RAM 300 has been described with respect to a monochrome embodiment, the same technique of storing the processed data for later display can be applied to a color embodiment without departing from the scope of the invention.

The present invention includes all such equivalents and modifications, and is limited only by the scope of the following claims.

What is claimed is:

1. A display enhancement apparatus for displaying digital data representing a plurality of images, comprising:
   a display having a plurality of addressable display elements with independently adjustable intensity levels;
   means for compressing said digital data to produce respective bit maps representative of said images, each of said bit maps including digital intensity values which are each representative of an intensity level of a corresponding one of said display elements, and wherein said digital intensity values are based on a local density of said compressed digital data for a corresponding one of said plurality of images;

overlapping data processing means for combining according to a predetermined criteria said digital intensity values from said respective bit maps which correspond to the same display element to generate a corresponding composite digital intensity value for each of said display elements; and means for adjusting the intensity level of each of said display elements in accordance with said corresponding composite digital intensity value.

2. The apparatus of claim 1, wherein each of said composite digital intensity values is representative of the summation of said corresponding digital intensity values.

3. The apparatus of claim 2, wherein said means for adjusting comprises mapping means for non-linearly mapping said composite digital intensity values to said intensity levels.

4. The apparatus of claim 1, wherein said display comprises an oscilloscope display and said images each comprise a waveform.

5. The apparatus of claim 4, wherein said display is of a type selected from the group of raster, liquid crystal, gas plasma, electroluminescent, vector scanned, and color shutter type displays.

6. The apparatus of claim 4, wherein said display comprises a monochrome display.

7. The apparatus of claim 4, wherein said display comprises a color display.

8. The apparatus of claim 7, wherein each of said composite digital intensity values is representative of the summation of said corresponding digital intensity values.

9. The apparatus of claim 8, each of said images being identified by a respective color on said display, and further comprising comparator means for controlling the color of each of said display elements as a function of the corresponding digital intensity values.

10. The apparatus of claim 9, wherein said comparator means causes the color of each of said display elements to be the color identified with the image having the highest digital intensity value corresponding to said display element.

11. The apparatus of claim 7, wherein each of said composite digital intensity values is representative of the highest of said corresponding digital intensity values.

12. The apparatus of claim 11, each of said images being identified by a respective color on said display, and further comprising comparator means for controlling the color of each of said display elements as a function of the corresponding digital intensity values.

13. The apparatus of claim 12, wherein said comparator means causes the color of each of said display elements to be the color identified with the image having the highest digital intensity value corresponding to said display element.

14. A display enhancement apparatus for displaying digital data representing a plurality of images, comprising:

a color display having a plurality of addressable display elements with independently adjustable color and intensity levels;

means for processing said digital data to produce respective bit maps representative of said images, each of said bit maps including digital intensity values which are each representative of an intensity level of a corresponding one of said display elements;

overlapping data processing means for summing said digital intensity values which correspond to the same display element to generate a corresponding composite digital intensity value for each of said display elements; and means for adjusting the intensity level of each of said display elements in accordance with said corresponding composite digital intensity value.

15. The apparatus of claim 14, each of said images being identified by a respective color on said display, and further comprising comparator means for controlling the color of each of said display elements as a function of the corresponding digital intensity values.

16. The apparatus of claim 15, wherein said comparator means causes the color of each of said display elements to be the color identified with the image having the highest digital intensity value corresponding to said display element.

17. The apparatus of claim 14, wherein said means for adjusting comprises mapping means for non-linearly mapping said composite digital intensity values to said intensity levels.

18. The apparatus of claim 14, wherein said display comprises an oscilloscope display and said images each comprise a waveform.

19. A display enhancement apparatus for displaying digital data representing a plurality of images, comprising:

a display having a plurality of addressable display elements with independently adjustable intensity levels;

means for compressing said digital data to produce respective sets of digital intensity values representative of said images, each of said digital intensity values being representative of an intensity level of a corresponding one of said display elements, and wherein said digital intensity values are based on a local density of said compressed digital data for a corresponding one of said plurality of images;

overlapping data processing means for summing said digital intensity values from said respective sets which correspond to the same display element to generate a corresponding composite digital intensity value for each of said display elements; and means for adjusting the intensity level of each of said display elements in accordance with said corresponding composite digital intensity value.

20. The apparatus of claim 19, wherein said means for adjusting comprises mapping means for non-linearly mapping said composite digital intensity values to said intensity levels.

21. The apparatus of claim 19, wherein said display comprises an oscilloscope display and said images each comprise a waveform.

22. The apparatus of claim 4, wherein said digital data represents said waveforms as a function of time, and said means for compressing compresses said digital data with respect to time whereby said digital intensity values are indicative of the local density of said compressed digital data with respect to time.

23. The apparatus of claim 22, wherein the waveforms are displayed on the display by said means for adjusting so as to resemble a real-time oscilloscope display.

24. The apparatus of claim 4, further comprising means for acquiring said digital data for each of said waveforms during a respective time-based acquisition period, and wherein said digital data for each of said waveforms is compressed by said means for compressing with respect to time to produce said digital intensity values.

25. The apparatus of claim 24, wherein the waveforms are displayed on the display by said means for adjusting so as to resemble a real-time oscilloscope display.

* * * * *